(12) United States Patent
Jeng et al.

(10) Patent No.: US 10,985,100 B2
(45) Date of Patent: Apr. 20, 2021

(54) CHIP PACKAGE WITH RECESSED INTERPOSER SUBSTRATE

(71) Applicant: Taiwan Semiconductor Manufacturing Co., Ltd., Hsinchu (TW)

(72) Inventors: Shin-Puu Jeng, Po-Shan Village (TW); Po-Hao Tsai, Taoyuan (TW); Po-Yao Chuang, Hsinchu (TW); Feng-Cheng Hsu, New Taipei (TW); Shuo-Mao Chen, New Taipei (TW); Techi Wong, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/717,901

(22) Filed: Dec. 17, 2019

(65) Prior Publication Data
US 2020/0126812 A1    Apr. 23, 2020

Related U.S. Application Data

(62) Division of application No. 15/874,541, filed on Jan. 18, 2018, now Pat. No. 10,515,827.
(Continued)

(51) Int. Cl.
*H01L 23/498*    (2006.01)
*H01L 25/10*    (2006.01)
(Continued)

(52) U.S. Cl.
CPC ...... *H01L 23/49838* (2013.01); *H01L 21/486* (2013.01); *H01L 21/4853* (2013.01);
(Continued)

(58) Field of Classification Search
CPC ......... H01L 24/81; H01L 24/73; H01L 24/32; H01L 24/92; H01L 25/50; H01L 24/96;
(Continued)

(56) References Cited

U.S. PATENT DOCUMENTS 9,000,584 B2    4/2015 Lin et al.
9,048,222 B2    6/2015 Hung et al.
(Continued)

*Primary Examiner* — Michael Jung
(74) *Attorney, Agent, or Firm* — Birch, Stewart, Kolasch & Birch, LLP

(57) ABSTRACT

A chip package is provided. The chip package includes a redistribution structure including an insulating layer and a wiring layer. The wiring layer is in the insulating layer. The chip package includes a chip over the redistribution structure and electrically connected to the wiring layer. The chip package includes an interposer substrate over the redistribution structure and the chip, wherein a portion of the chip is in the interposer substrate. The chip package includes a conductive structure between the interposer substrate and the redistribution structure and electrically connected to the wiring layer. The conductive structure includes a conductive bump or a conductive pillar. The chip package includes a molding layer surrounding the interposer substrate and the conductive structure. The molding layer is partially between the interposer substrate and the redistribution structure and partially between the interposer substrate and the chip.

20 Claims, 33 Drawing Sheets

Related U.S. Application Data

(60) Provisional application No. 62/579,241, filed on Oct. 31, 2017.

(51) Int. Cl.
| | | |
|---|---|---|
| *H01L 21/52* | (2006.01) | |
| *H01L 21/56* | (2006.01) | |
| *H01L 23/00* | (2006.01) | |
| *H01L 21/48* | (2006.01) | |
| *H01L 23/053* | (2006.01) | |
| *H01L 21/683* | (2006.01) | |
| *H01L 25/00* | (2006.01) | |
| *H01L 23/31* | (2006.01) | |

(52) U.S. Cl.
CPC .......... *H01L 21/4857* (2013.01); *H01L 21/52* (2013.01); *H01L 21/563* (2013.01); *H01L 21/565* (2013.01); *H01L 21/568* (2013.01); *H01L 21/6835* (2013.01); *H01L 23/053* (2013.01); *H01L 23/49822* (2013.01); *H01L 24/16* (2013.01); *H01L 24/27* (2013.01); *H01L 24/32* (2013.01); *H01L 24/73* (2013.01); *H01L 24/81* (2013.01); *H01L 24/92* (2013.01); *H01L 24/96* (2013.01); *H01L 25/105* (2013.01); *H01L 25/50* (2013.01); *H01L 21/561* (2013.01); *H01L 23/3128* (2013.01); *H01L 2221/68345* (2013.01); *H01L 2221/68359* (2013.01); *H01L 2221/68368* (2013.01); *H01L 2224/0401* (2013.01); *H01L 2224/16227* (2013.01); *H01L 2224/16235* (2013.01); *H01L 2224/26175* (2013.01); *H01L 2224/32225* (2013.01); *H01L 2224/73204* (2013.01); *H01L 2224/73253* (2013.01); *H01L 2224/81005* (2013.01); *H01L 2224/81191* (2013.01); *H01L 2224/83191* (2013.01); *H01L 2224/92125* (2013.01); *H01L 2224/92225* (2013.01); *H01L 2224/97* (2013.01); *H01L 2225/107* (2013.01); *H01L 2225/1023* (2013.01); *H01L 2225/1041* (2013.01); *H01L 2225/1058* (2013.01); *H01L 2924/15311* (2013.01)

(58) Field of Classification Search
CPC . H01L 24/27; H01L 23/053; H01L 23/49822; H01L 25/49838; H01L 25/105
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,576,917 B1 | 2/2017 | Huemoeller et al. |
| 2013/0182402 A1* | 7/2013 | Chen .............. H05K 7/1061 361/807 |
| 2014/0264811 A1 | 9/2014 | Wu |
| 2014/0264857 A1 | 9/2014 | Wu |
| 2016/0163650 A1 | 6/2016 | Gao et al. |
| 2016/0260684 A1* | 9/2016 | Zhai ................. H01L 25/50 |

\* cited by examiner

CHIP PACKAGE WITH RECESSED INTERPOSER SUBSTRATE

PRIORITY CLAIM AND CROSS-REFERENCE

This Application claims the benefit of U.S. Provisional Application No. 62/579,241, filed on Oct. 31, 2017, and entitled "Fan Out Package with interposer", the entirety of which is incorporated by reference herein.

This application is a Divisional of U.S. application Ser. No. 15/874,541, filed on Jan. 18, 2018, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers using photolithography processes and etching processes to form circuit components and elements thereon.

Many integrated circuits are typically manufactured on a semiconductor wafer. The semiconductor wafer may be singulated into dies. The dies may be packaged, and various technologies have been developed for packaging.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1D-1 is a top view of the chip package of FIG. 1D, in accordance with some embodiments.

DETAILED DESCRIPTION

Figure 1A:
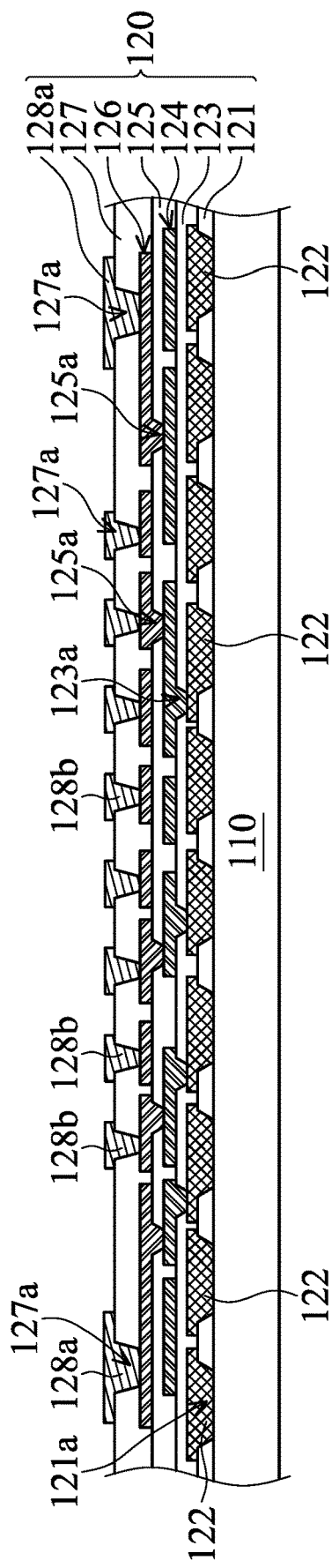
FIGS. 1A-1J are cross-sectional views of various stages of a process for forming a chip package, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1J are cross-sectional views of various stages of a process for forming a chip package, in accordance with some embodiments. As shown in FIG. 1A, a carrier substrate 110 is provided, in accordance with some embodiments. The carrier substrate 110 is configured to provide temporary mechanical and structural support during subsequent processing steps, in accordance with some embodiments. The carrier substrate 110 includes glass, silicon, silicon oxide, aluminum oxide, metal, a combination thereof, and/or the like, in accordance with some embodiments. The carrier substrate 110 includes a metal frame, in accordance with some embodiments.

As shown in FIG. 1A, a redistribution structure 120 is formed over the carrier substrate 110, in accordance with some embodiments. The formation of the redistribution structure 120 includes forming an insulating layer 121 over the carrier substrate 110; forming conductive pads 122 over the insulating layer 121 and in through holes 121a of the insulating layer 121; forming an insulating layer 123 over the insulating layer 121 and the conductive pads 122; forming a wiring layer 124 over the insulating layer 123 and in through holes 123a of the insulating layer 123; forming an insulating layer 125 over the insulating layer 123 and the wiring layer 124; forming a wiring layer 126 over the insulating layer 125 and in through holes 125a of the insulating layer 125; forming an insulating layer 127 over the insulating layer 125 and the wiring layer 126; and forming conductive pads 128a and 128b over the insulating layer 127 and in through holes 127a of the insulating layer 127. The conductive pad 128a is wider than the conductive pad 128b, in accordance with some embodiments. The conductive pads 128a surround the conductive pads 128b, in accordance with some embodiments.

In some embodiments, the conductive pads 122 are in direct contact with the carrier substrate 110. In some other embodiments (not shown), the conductive pads 122 are spaced apart from the carrier substrate 110. The wiring layers 124 and 126 are electrically connected to each other, in accordance with some embodiments. The conductive pads 122, 128a, and 128b are electrically connected to the wiring layers 124 and 126, in accordance with some embodiments.

The insulating layers 121, 123, 125, and 127 are made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The wiring layers 124 and 126 and the conductive pads 122, 128a and 128b are made of a conductive material, such as metal (e.g. copper, aluminum, or tungsten), in accordance with some embodiments.

Figure 1B:
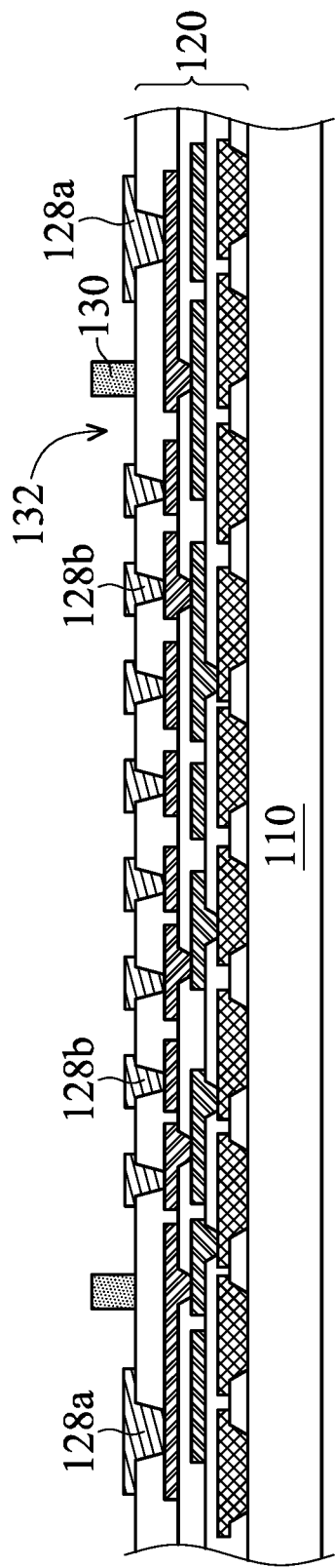

As shown in FIG. 1B, dam structures 130 are formed over the redistribution structure 120, in accordance with some embodiments. For the sake of simplicity, FIGS. 1B-1E only show one of the dam structures 130, in accordance with some embodiments. The dam structure 130 has an opening 132, in accordance with some embodiments. The dam structure 130 is a ring structure, in accordance with some embodiments. The dam structure 130 continuously surrounds the conductive pads 128b, in accordance with some embodiments.

The dam structure 130 is made of a polymer material or a metal material, in accordance with some embodiments. The formation of the dam structure 130 includes forming a dam material layer over the redistribution structure 120; and performing a photolithography process and an etching process on the dam material layer. If the dam structure 130 is made of a photosensitive material, the formation of the dam structure 130 includes forming a dam material layer over the redistribution structure 120; and performing a photolithography process. In some embodiments, the dam structures 130 are not formed.

Figure 1C:
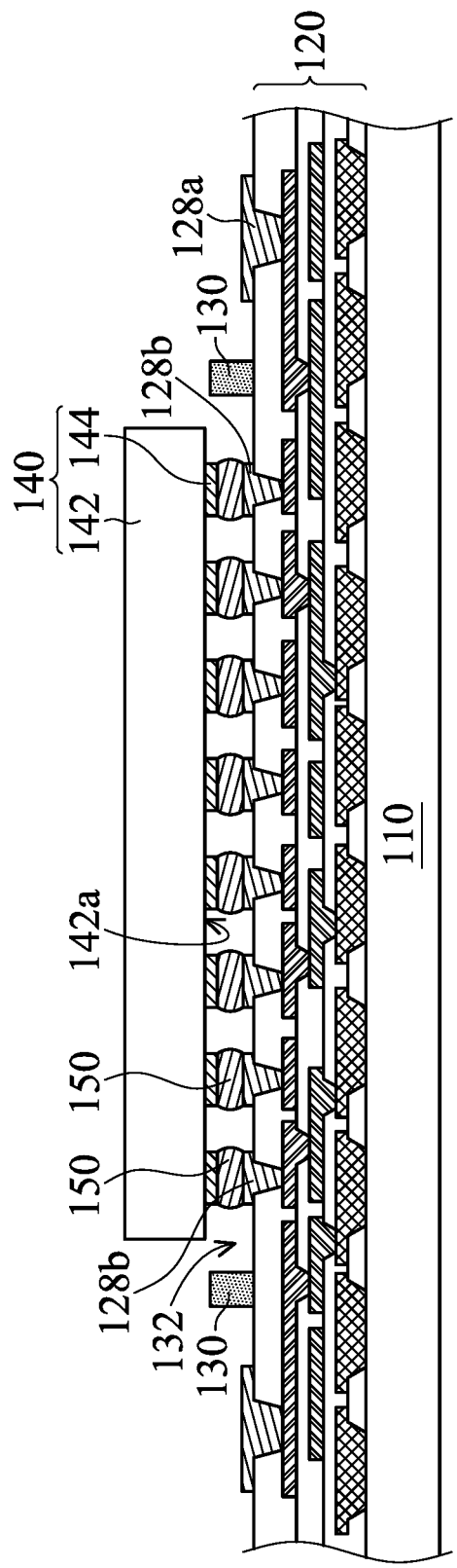

As shown in FIG. 1C, chips 140 are bonded to the redistribution structure 120 through conductive bumps 150, in accordance with some embodiments. For the sake of simplicity, FIGS. 1C-1E only show one of the chips 140, in accordance with some embodiments. The chip 140 is over or in the opening 132 of the dam structure 130, in accordance with some embodiments.

The chip 140 has a substrate 142 and conductive pads 144, in accordance with some embodiments. The substrate 142 has a surface 142a facing the redistribution structure 120, in accordance with some embodiments. The conductive pads 144 are over the surface 142a, in accordance with some embodiments.

In some embodiments, electronic elements (not shown) are formed on or in the substrate 142. The electronic elements include active elements (e.g. transistors, diodes, or the like) and/or passive elements (e.g. resistors, capacitors, inductors, or the like). The conductive pads 144 are electrically connected to the electronic elements, in accordance with some embodiments.

In some embodiments, the substrate 142 is made of at least an elementary semiconductor material including silicon or germanium in a single crystal, polycrystal, or amorphous structure. In some other embodiments, the substrate 142 is made of a compound semiconductor, such as silicon carbide, gallium arsenide, gallium phosphide, indium phosphide, indium arsenide, an alloy semiconductor, such as SiGe, or GaAsP, or a combination thereof.

The substrate 142 may also include multi-layer semiconductors, semiconductor on insulator (SOI) (such as silicon on insulator or germanium on insulator), or a combination thereof. The conductive pads 144 is made of a conductive material, such as metal (e.g., copper, aluminum, nickel, or combinations thereof), in accordance with some embodiments.

The conductive bumps 150 are between the conductive pads 128b and 144 to electrically connect the conductive pads 128b to the conductive pads 144, in accordance with some embodiments. The conductive bumps 150 are in the opening 132, in accordance with some embodiments. The conductive bumps 150 are made of a solder material, such as Sn and Ag or another suitable conductive material (e.g., gold), in accordance with some embodiments. The conductive bumps 150 are solder balls, in accordance with some embodiments.

Figure 1D:
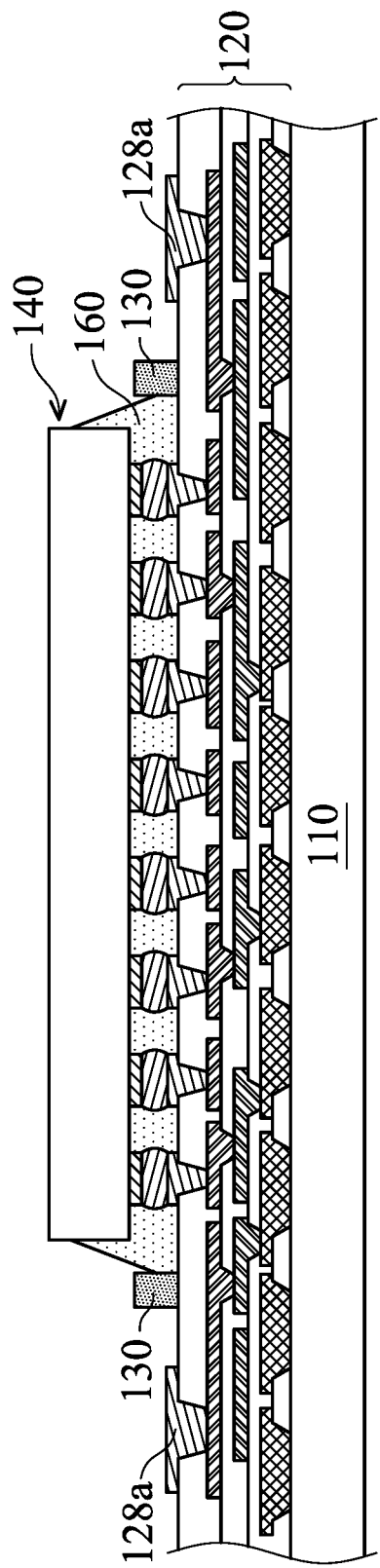
Figures 1, 1D:
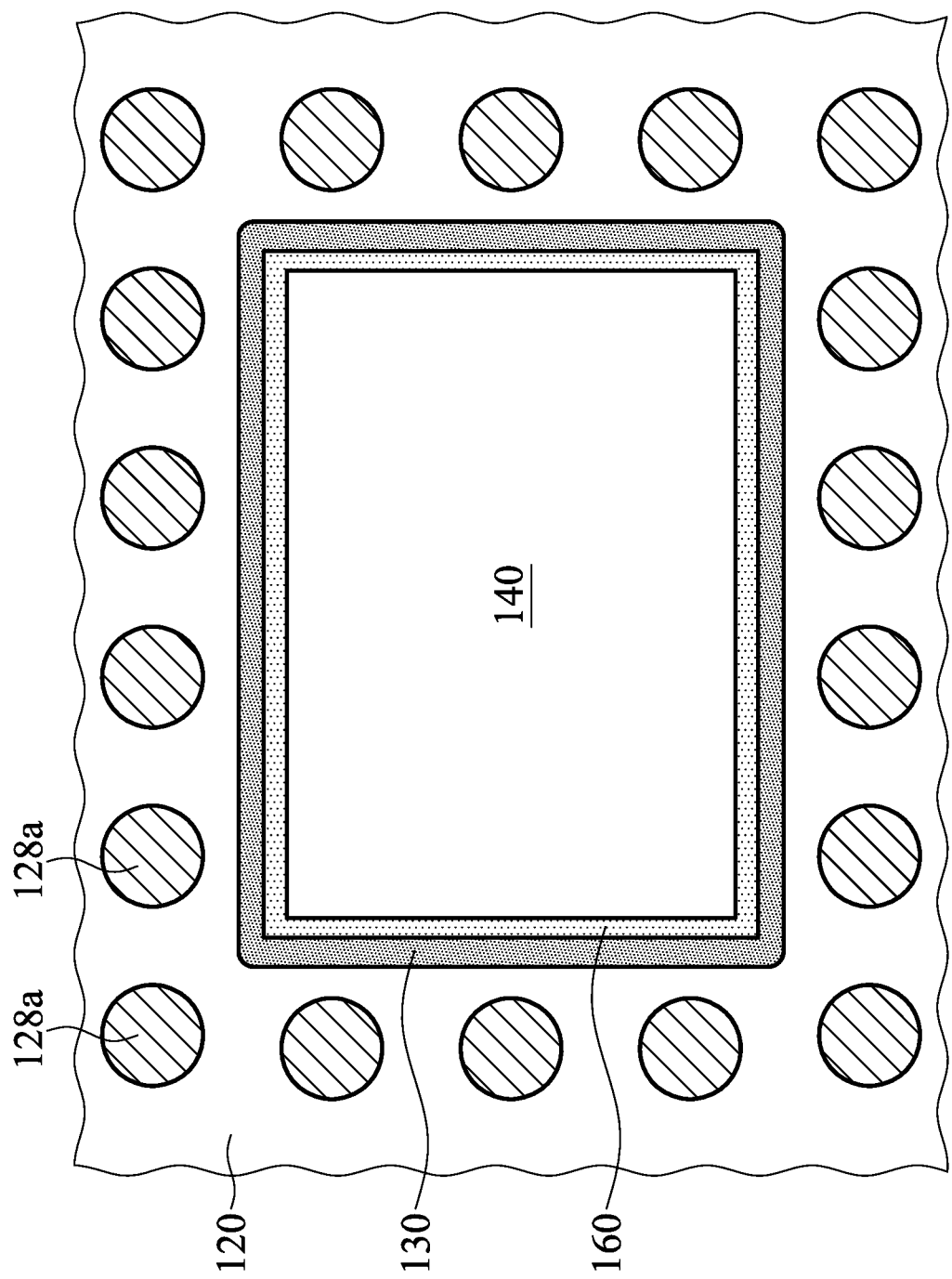

FIG. 1D-1 is a top view of the chip package of FIG. 1D, in accordance with some embodiments. As shown in FIGS. 1D and 1D-1, an underfill layer 160 is formed between the chip 140 and the redistribution structure 120, in accordance with some embodiments. The dam structure 130 continuously surrounds the entire underfill layer 160 to prevent the underfill layer 160 from extending onto the conductive pads 128a, in accordance with some embodiments. The underfill layer 160 is made of an insulating material, such as a polymer material or a molding compound material consisting of epoxy and filler material, in accordance with some embodiments.

Figure 1E:
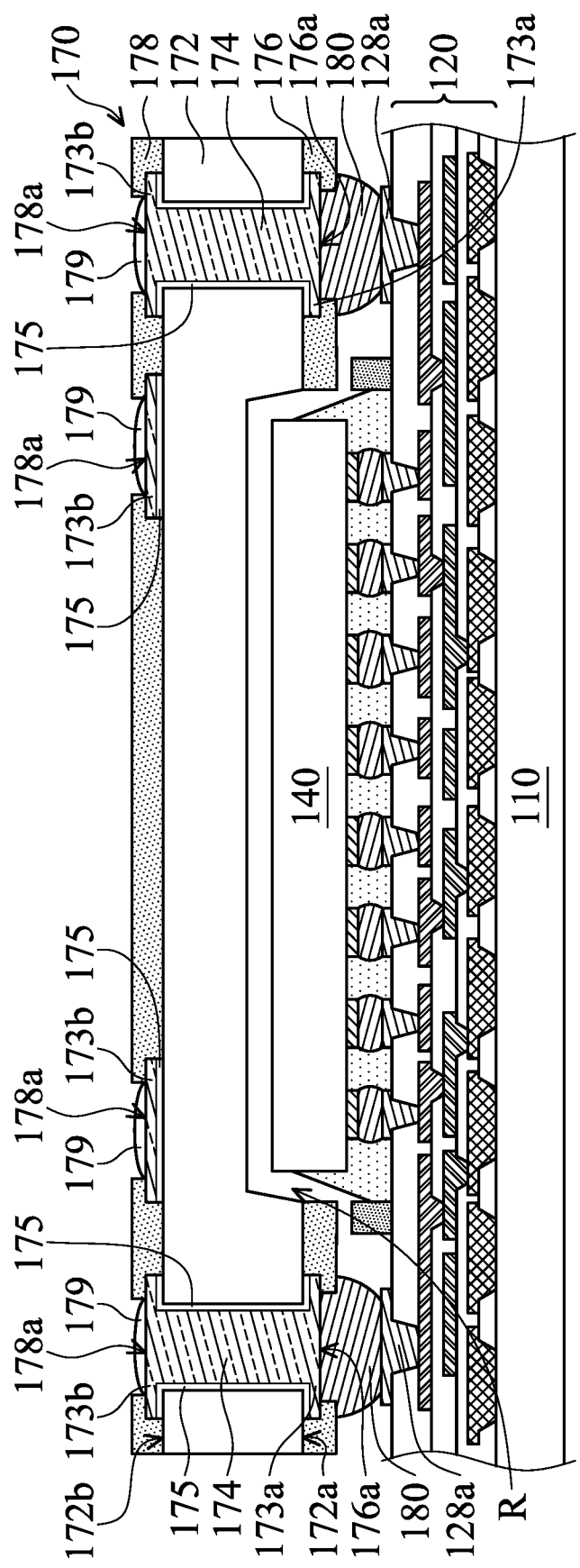

As shown in FIG. 1E, interposer substrates 170 are bonded to the redistribution structure 120 through conductive structures 180, in accordance with some embodiments. For the sake of simplicity, FIG. 1E only shows one of the interposer substrates 170, in accordance with some embodiments. The chip 140 is between the interposer substrate 170 and the redistribution structure 120, in accordance with some embodiments. The interposer substrate 170 has a recess R adjacent to the redistribution structure 120, in accordance with some embodiments. The recess R faces the redistribution structure 120, in accordance with some embodiments. In some embodiments, a portion of the chip 140 is in the recess R.

The interposer substrate 170 includes a substrate 172, conductive pads 173a and 173b, conductive via structures 174, insulating layers 175, 176, and 178, and wiring layers (not shown), in accordance with some embodiments. The substrate 172 has two opposite surfaces 172a and 172b, in accordance with some embodiments. The surface 172a faces the redistribution structure 120, in accordance with some embodiments.

The substrate 172 is made of a fiber material, a polymer material, a semiconductor material, a glass material, a metal material, or another suitable material. The fiber material includes, for example, a glass fiber material. The semiconductor material includes, for example, silicon or germanium.

The conductive pads 173a are over the surface 172a, in accordance with some embodiments. The conductive pads 173b are over the surface 172b, in accordance with some embodiments. The conductive via structures 174 pass through the substrate 172, in accordance with some embodiments. The conductive via structures 174 are between and connected to the conductive pads 173a and 173b, in accordance with some embodiments.

The wiring layers (not shown) are formed over the surface 172b and are electrically connected to the conductive pads 173b and the conductive via structures 174, in accordance with some embodiments. The wiring layers (not shown) are further formed over the surface 172a and are electrically connected to the conductive pads 173a and the conductive via structures 174, in accordance with some embodiments. The conductive via structures 174, the conductive pads 173a and 173b, and the wiring layers are made of a conductive material, such as copper, aluminum, or tungsten, in accordance with some embodiments.

The insulating layer 175 is between the conductive via structures 174 and the substrate 172, between the conductive pads 173a and the substrate 172, and between the conductive pads 173b and the substrate 172, in accordance with some embodiments. The conductive pads 173a and 173b and the conductive via structures 174 are electrically insulated from the substrate 172 by the insulating layer 175, in accordance with some embodiments.

The insulating layer 176 is formed over the surface 172a, in accordance with some embodiments. The insulating layer 176 has openings 176a respectively exposing the conductive pads 173a thereover, in accordance with some embodiments. The insulating layer 178 is formed over the surface 172b, in accordance with some embodiments.

The insulating layer 178 has openings 178a respectively exposing the conductive pads 173b thereunder, in accordance with some embodiments. The recess R passes through the insulating layer 176 and extends into the substrate 172, in accordance with some embodiments. The insulating layers 175, 176, and 178 are made of an insulating material, such as oxide (e.g., silicon oxide), in accordance with some embodiments.

The interposer substrate 170 may further include conductive layers 179. The conductive layers 179 are respectively formed over the conductive pads 173b, in accordance with some embodiments. The conductive layers 179 are made of a surface finish material (e.g., nickel, palladium, and/or gold) or a solder material, such as Sn and Ag or another suitable conductive material, in accordance with some embodiments.

Figure 2:
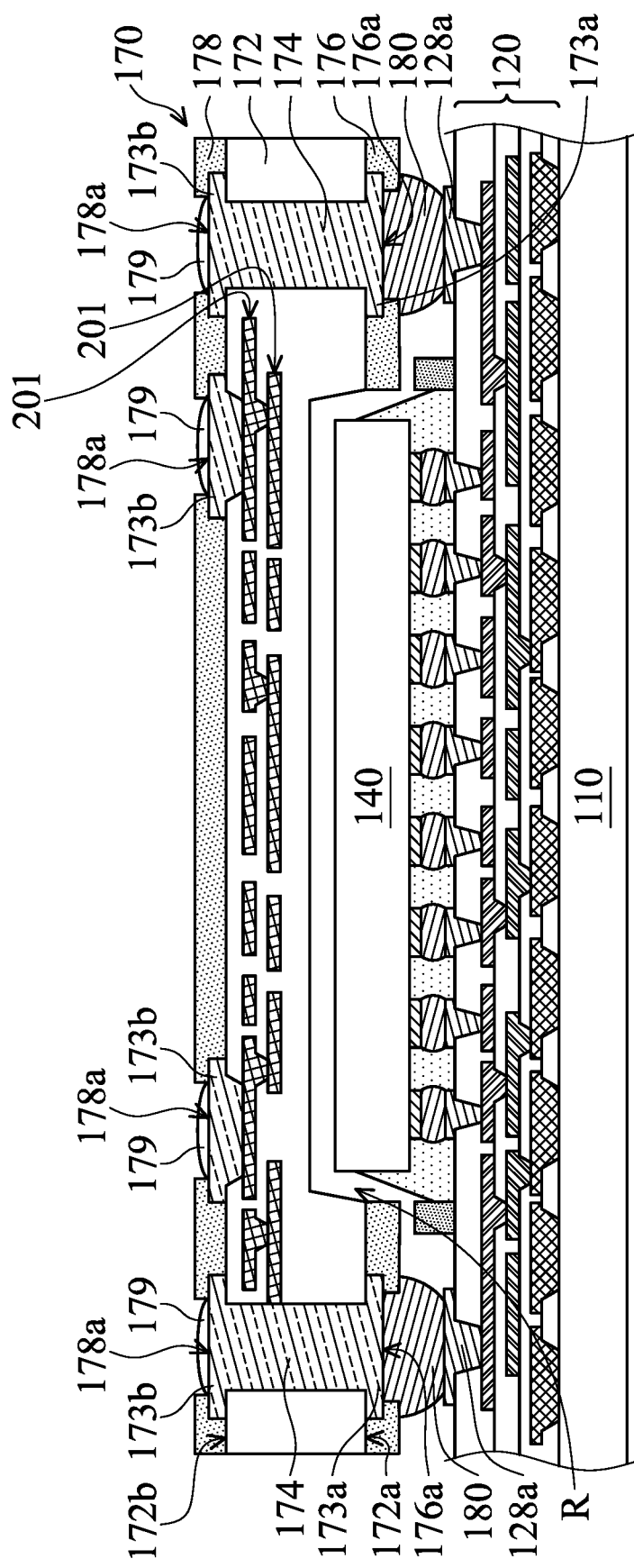
FIG. 2 is a cross-sectional view of a chip package, in accordance with some embodiments.

In some other embodiments, as shown in FIG. 2, the substrate 172 is made of an insulating material, and the insulating layer 175 is not formed. As shown in FIG. 2, the interposer substrate 170 further includes wiring layers 201 formed in the substrate 172, in accordance with some embodiments.

The wiring layers 201 electrically connect the conductive pads 173b (e.g., the conductive pads 173b over the recess R) to the conductive via structures 174, in accordance with some embodiments. The interposer substrate 170 of FIG. 1E may be replaced by the interposer substrate 170 of FIG. 2.

Referring back to FIG. 1E, the conductive structures 180 are formed between the conductive pads 173a and 128a, in accordance with some embodiments. The conductive structures 180 electrically connect the conductive pads 173a to the conductive pads 128a, in accordance with some embodiments. The conductive structures 180 are conductive bumps or conductive pillars, in accordance with some embodiments. The conductive structures 180 are made of a conductive material, such as a metal material (e.g., copper) or a solder material (e.g., Sn and Ag), in accordance with some embodiments.

Figure 1F:
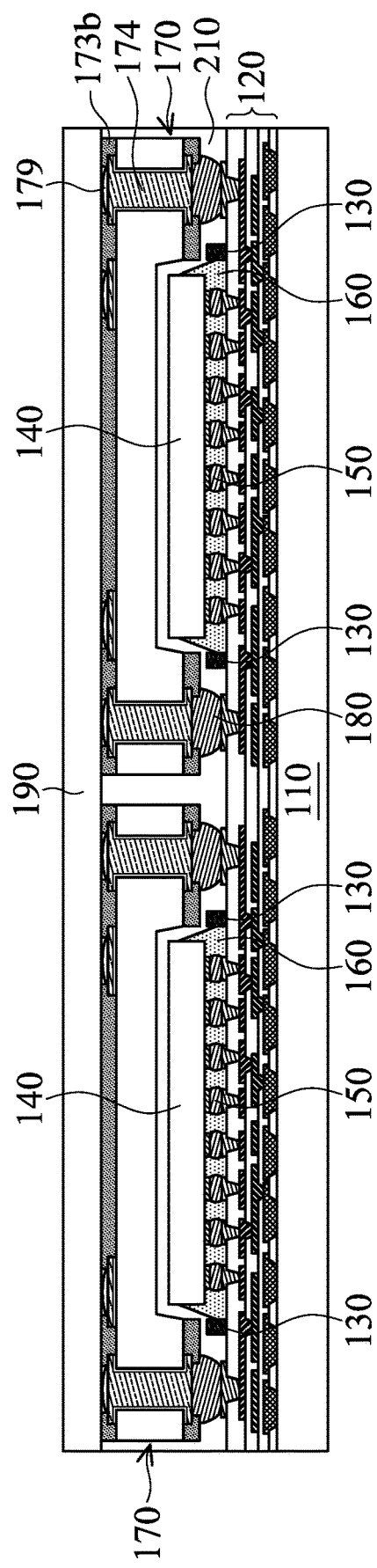

As shown in FIG. 1F, a release film 190 is formed over the interposer substrates 170 to cover the conductive layers 179 and the conductive pads 173b, in accordance with some embodiments. The release film 190 is used to prevent the conductive layers 179 and the conductive pads 173b from being covered by a molding layer formed in the subsequent process, in accordance with some embodiments. The release film 190 is made of a polymer material or another suitable material.

Thereafter, as shown in FIG. 1F, a molding layer 210 is formed between the release film 190, the interposer substrates 170, the redistribution structure 120, and the chips 140, in accordance with some embodiments. In some embodiments, a thermal process is performed on the molding layer 210 to cure the molding layer 210. The molding layer 210 surrounds the interposer substrates 170, the chips 140, the conductive bumps 150, the underfill layer 160, the conductive structures 180, and the dam structures 130, in accordance with some embodiments. The molding layer 210 is made of a polymer material or another suitable insulating material.

Figure 1G:
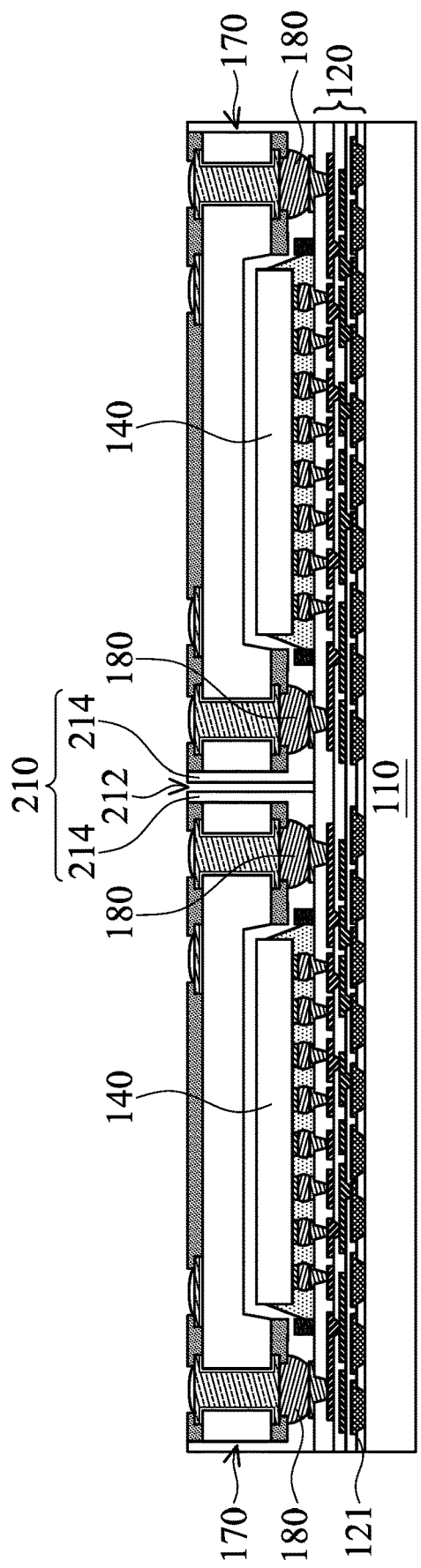

As shown in FIG. 1G, the release film 190 is removed, in accordance with some embodiments. As shown in FIG. 1G, a trench 212 is formed in the molding layer 210, in accordance with some embodiments. The trench 212 passes through the molding layer 210 between the interposer substrates 170 and between the conductive structures 180 under different interposer substrates 170, in accordance with some embodiments.

The trench 212 divides the molding layer 210 into portions 214, in accordance with some embodiments. The portions 214 are spaced apart from each other, in accordance with some embodiments. Each of the portions 214 surrounds one of the interposer substrates 170 and the chip 140 under the one of the interposer substrates 170, in accordance with some embodiments. The trench 212 is formed using a cutting process, in accordance with some embodiments.

Figure 1H:
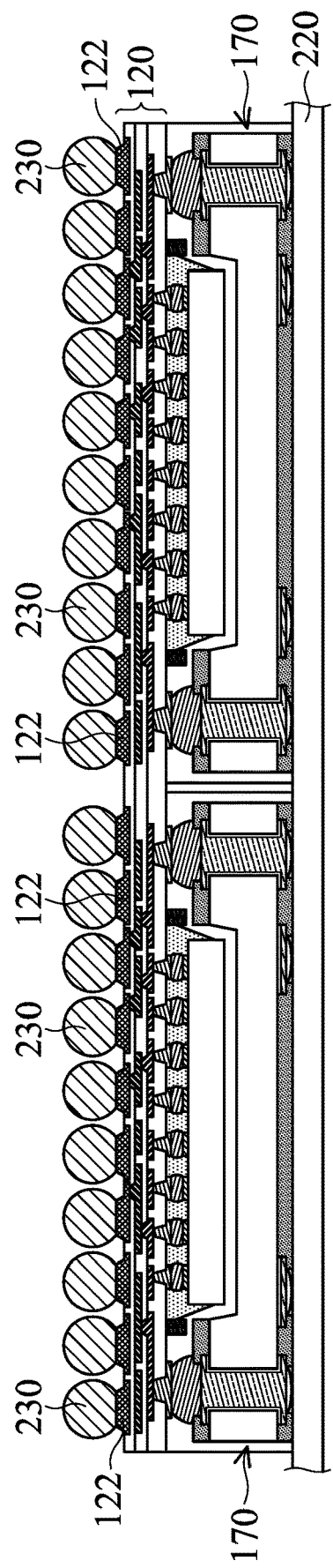

As shown in FIG. 1H, the carrier substrate 110 is removed, in accordance with some embodiments. As shown in FIG. 1H, the redistribution structure 120 is flipped upside down, in accordance with some embodiments. As shown in FIG. 1H, the redistribution structure 120 and the interposer substrates 170 are disposed over a carrier substrate 220, in accordance with some embodiments.

As shown in FIG. 1H, the insulating layer 121 is removed, in accordance with some embodiments. In some other embodiments (not shown), the insulating layer 121 is partially removed to expose the conductive pads 122. As shown in FIG. 1H, conductive bumps 230 are respectively formed over the conductive pads 122, in accordance with some embodiments. The conductive bumps 230 are made of a solder material, such as Sn and Ag or another suitable conductive material, in accordance with some embodiments.

Figure 1I:
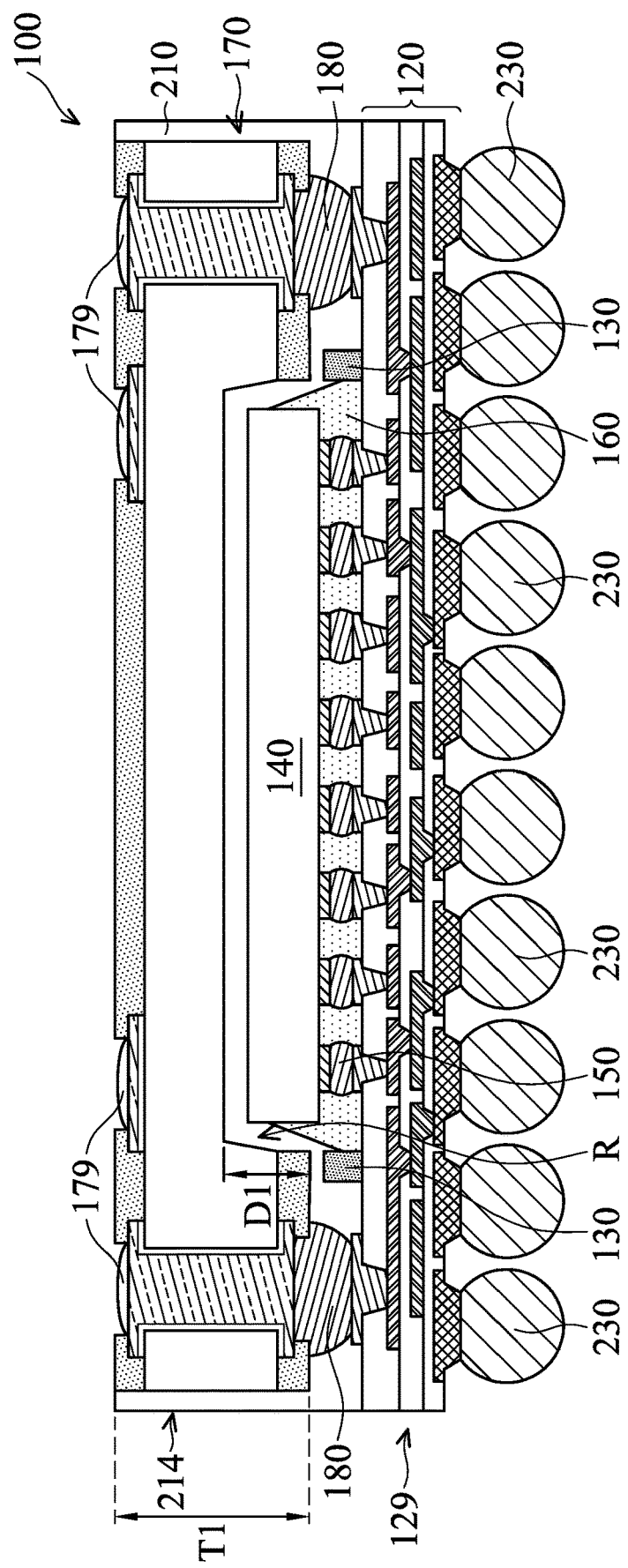

As shown in FIGS. 1H and 1I, a sawing process is performed on the redistribution structure 120 between the interposer substrates 170 to cut through the redistribution structure 120, in accordance with some embodiments. The redistribution structure 120 is cut into portions 129 spaced apart from each other, in accordance with some embodiments.

After the sawing process, the carrier substrate 220 is removed, in accordance with some embodiments. After the sawing process, chip packages 100 are substantially formed, in accordance with some embodiments. For the sake of simplicity, FIG. 1I only shows one of the chip packages 100, in accordance with some embodiments.

As shown in FIG. 1I, the chip package 100 has the portion 129 of the redistribution structure 120, the chip 140, the interposer substrate 170, the portion 214 of the molding layer 210, and the conductive bumps 150 and 230, in accordance with some embodiments. The interposer substrate 170 has a thickness T1 ranging from about 50 μm to about 300 μm, in accordance with some embodiments. The recess R has a depth D1 ranging from about 20 μm to about 270 μm, in accordance with some embodiments.

Figure 1J:
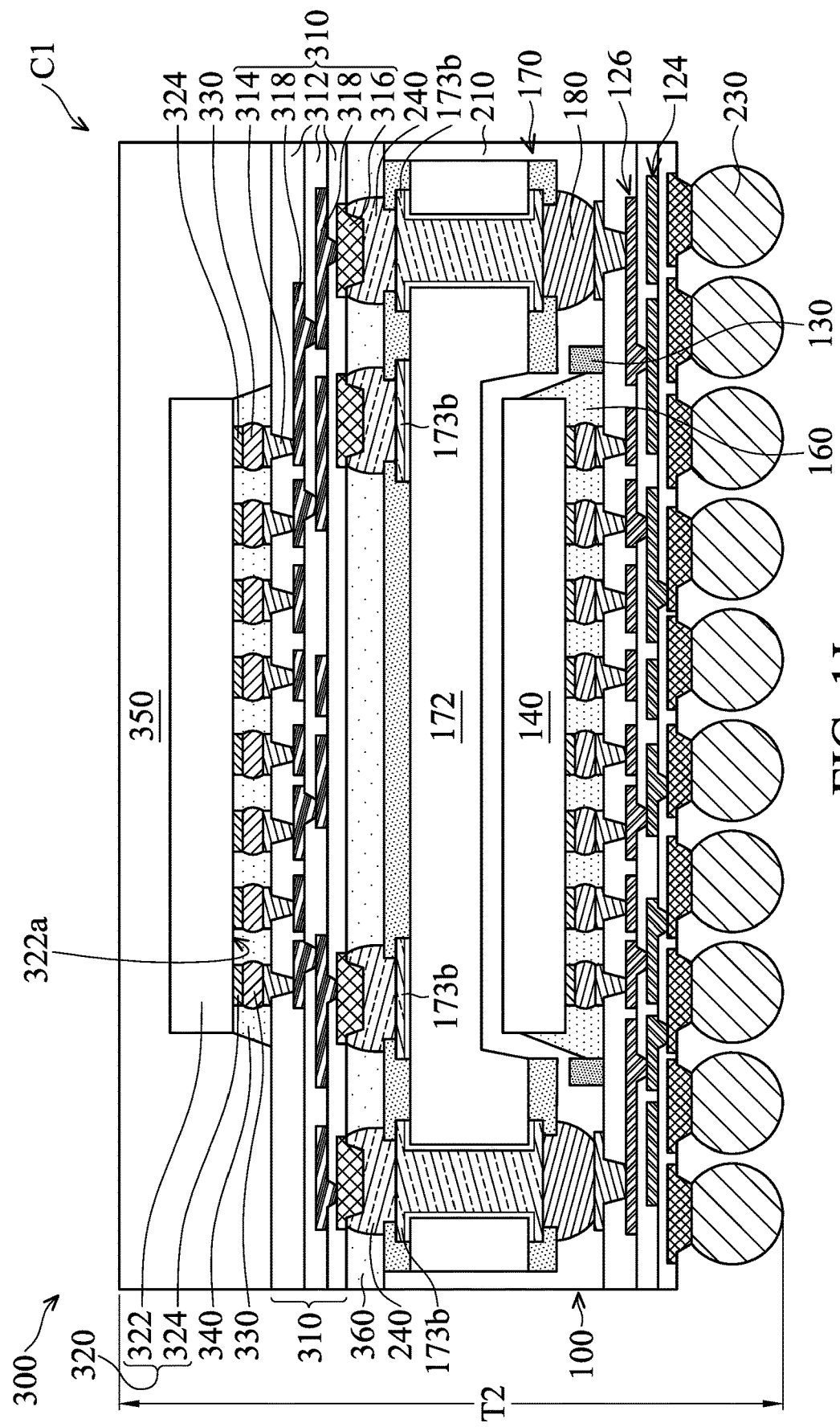

As shown in FIG. 1J, a package structure 300 is bonded to the interposer substrate 170 through conductive bumps 240, in accordance with some embodiments. The conductive bumps 240 are between the package structure 300 and the interposer substrate 170, in accordance with some embodiments. The conductive layers 179 are merged into the conductive bumps 240, in accordance with some embodiments.

The package structure 300 is electrically connected to the wiring layer 124 and 126 of the redistribution structure 120 through the conductive bumps 240, the interposer substrate 170, and the conductive structures 180, in accordance with some embodiments. The package structure 300 includes a memory device (e.g., a dynamic random access memory device), a passive device, a logic device, a radio frequency (RF) device, or another suitable device.

The package structure 300 includes a redistribution structure 310, a chip 320, conductive bumps 330, an underfill layer 340, and a molding layer 350, in accordance with some embodiments. The redistribution structure 310 includes an insulating layer 312, conductive pads 314 and 316, and wiring layers 318, in accordance with some embodiments. The insulating layer 312 may be a multilayer structure or a single layer structure.

The wiring layers 318 and portions of the conductive pads 314 and 316 are in the insulating layer 312, in accordance with some embodiments. The wiring layers 318 are electrically connected to the conductive pads 314 and 316, in accordance with some embodiments. The insulating layer 312 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The wiring layers 318 and the conductive pads 314 and 316 are made of a conductive material, such as metal (e.g. copper, aluminum, or tungsten), in accordance with some embodiments.

The chip 320 is bonded to the redistribution structure 310 through the conductive bumps 330, in accordance with some embodiments. The chip 320 has a substrate 322 and conductive pads 324, in accordance with some embodiments. The substrate 322 has a surface 322a facing the redistribution structure 310, in accordance with some embodiments. The conductive pads 324 are over the surface 322a, in accordance with some embodiments.

In some embodiments, electronic elements (not shown) are formed on or in the substrate 322. The electronic elements include active elements (e.g. transistors, diodes, or the like) and/or passive elements (e.g. resistors, capacitors, inductors, or the like). The conductive pads 324 are electrically connected to the electronic elements, in accordance with some embodiments.

In some embodiments, the substrate 322 is made of at least an elementary semiconductor material including silicon or germanium in a single crystal, polycrystal, or amorphous structure. In some other embodiments, the substrate 322 is made of a compound semiconductor, such as silicon carbide, gallium arsenide, gallium phosphide, indium phosphide, indium arsenide, an alloy semiconductor, such as SiGe, or GaAsP, or a combination thereof.

The substrate 322 may also include multi-layer semiconductors, semiconductor on insulator (SOI) (such as silicon on insulator or germanium on insulator), or a combination thereof. The conductive pads 324 is made of a conductive material, such as metal (e.g., copper or aluminum), in accordance with some embodiments.

The conductive bumps 330 are between and electrically connected to the conductive pads 314 and 324, in accordance with some embodiments. The conductive bumps 330 are made of a solder material, such as Sn and Ag or another suitable conductive material, in accordance with some embodiments.

The underfill layer 340 is formed between the chip 320 and the redistribution structure 310, in accordance with some embodiments. The underfill layer 340 is made of an insulating material, such as a polymer material, in accordance with some embodiments. The molding layer 350 is formed over the redistribution structure 310 to cover the chip 320 and the underfill layer 340, in accordance with some embodiments. The molding layer 350 is made of a polymer material or another suitable insulating material.

As shown in FIG. 1J, an underfill layer 360 is formed between the redistribution structure 310 and the interposer substrate 170 (or the molding layer 210), in accordance with some embodiments. The underfill layer 360 surrounds the conductive bumps 240, in accordance with some embodiments. The underfill layer 360 is made of an insulating material, such as a polymer material, in accordance with some embodiments. In this step, a chip package C1 is substantially formed, in accordance with some embodiments.

The chip package C1 includes the chip packages 100 and 300, the conductive bumps 240, and the underfill layer 360, in accordance with some embodiments. In the chip package C1, the chip 140 is partially or entirely positioned in the interposer substrate 170, in accordance with some embodiments. Therefore, the total thickness T2 of the chip package C1 is decreased, in accordance with some embodiments.

The rigidity of the interposer substrate 170 is greater than the rigidity of the molding layer 210, in accordance with some embodiments. Therefore, the interposer substrate 170 may decrease the warpage of the chip package 100. As a result, the bonding yield between the chip packages 100 and 300 is improved, in accordance with some embodiments. In some embodiments, the interposer substrate 170 enhances the stiffness and bending strength of the chip package 100.

The interposer substrate 170 is a rigid substrate, in accordance with some embodiments. Therefore, the interposer substrate 170 (including the conductive pads 173b) is substantially not affected by the stress caused by thermal expansion mismatch between the molding layer 210 and the chip 140, in accordance with some embodiments. As a result, the bonding yield between the conductive pads 173b and the conductive bumps 240 is improved, in accordance with some embodiments.

Figure 3A:
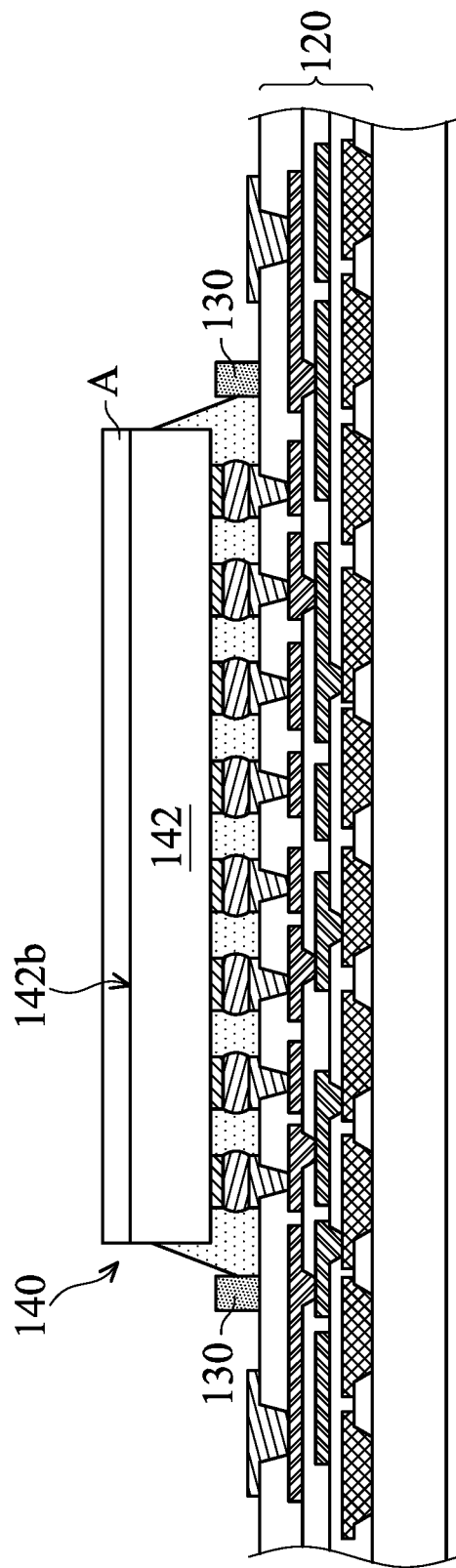
FIGS. 3A-3B are cross-sectional views of various stages of a process for forming a chip package, in accordance with some embodiments.
Figure 3B:
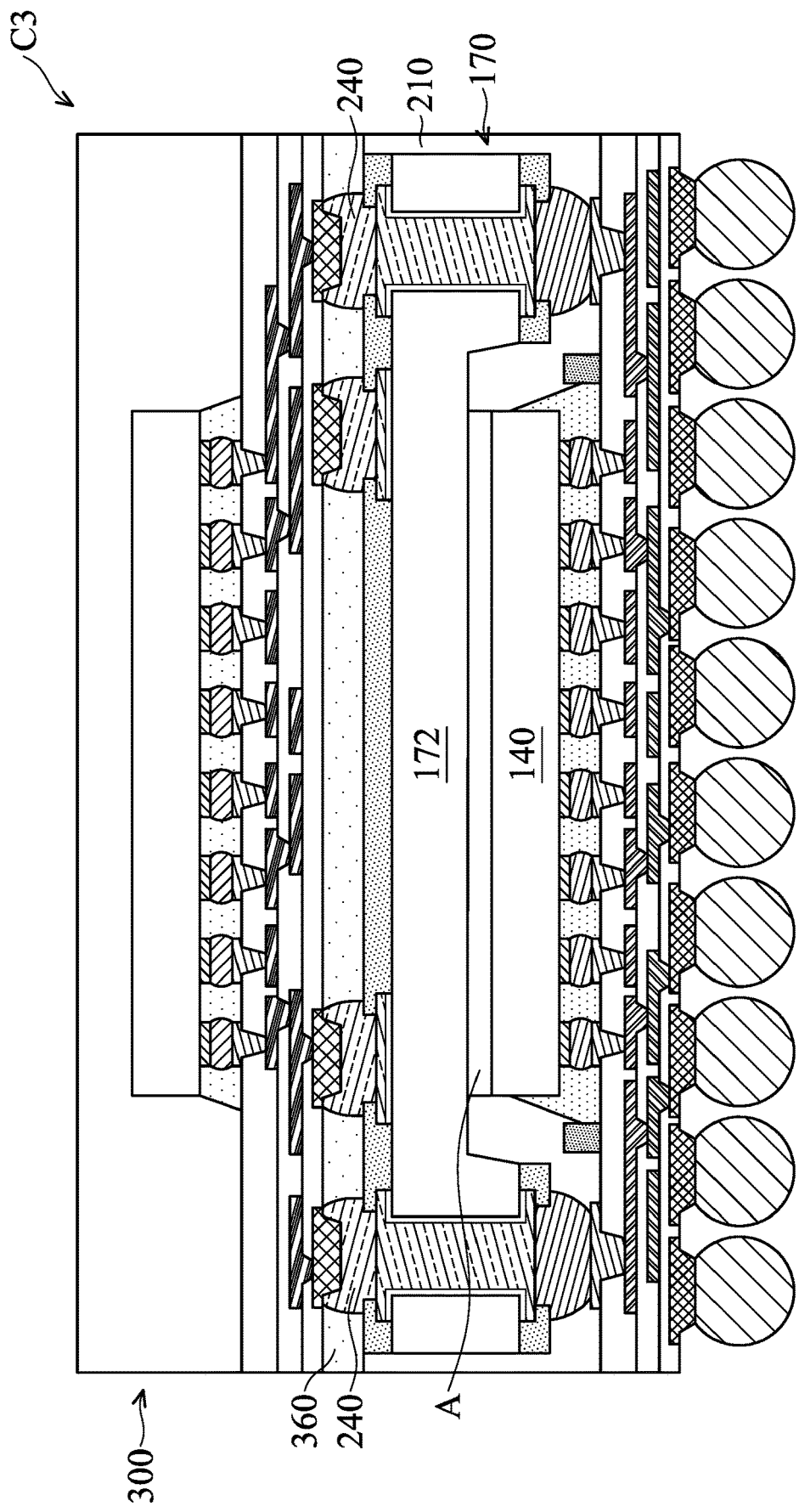

FIGS. 3A-3B are cross-sectional views of various stages of a process for forming a chip package, in accordance with some embodiments. After the step of FIG. 1D is performed, as shown in FIG. 3A, an adhesive layer A is formed over a top surface 142b of the substrate 142 of the chip 140, in accordance with some embodiments. The adhesive layer A is a film, a glue layer, or a paste layer, in accordance with some embodiments.

The adhesive layer A is made of a polymer material or a high thermal conductivity material, in accordance with some embodiments. The high thermal conductivity material has a thermal conductivity (k) greater than about 1 $Wm^{-1}K^{-1}$, in accordance with some embodiments. The high thermal conductivity material includes $Al_2O_3$ and/or graphene, in accordance with some embodiments. The adhesive layer A is formed using a coating process, a lamination process, or a deposition process, in accordance with some embodiments.

As shown in FIG. 3B, the steps of FIGS. 1E-1J are performed, in accordance with some embodiments. As shown in FIG. 3B, a chip package C3 is formed, in accordance with some embodiments. The chip package C3 is similar to the chip package C1 of FIG. 1J, except that the chip package C3 further has the adhesive layer A, in accordance with some embodiments. The adhesive layer A is in direct contact with the interposer substrate 170 (or the substrate 172) and the chip 140, in accordance with some embodiments.

The adhesive layer A is used to bond the interposer substrate 170 to the chip 140, in accordance with some embodiments. The adhesive layer A is used to dissipate the heat generated from the chip 140 to the interposer substrate 170, in accordance with some embodiments.

Figure 4:
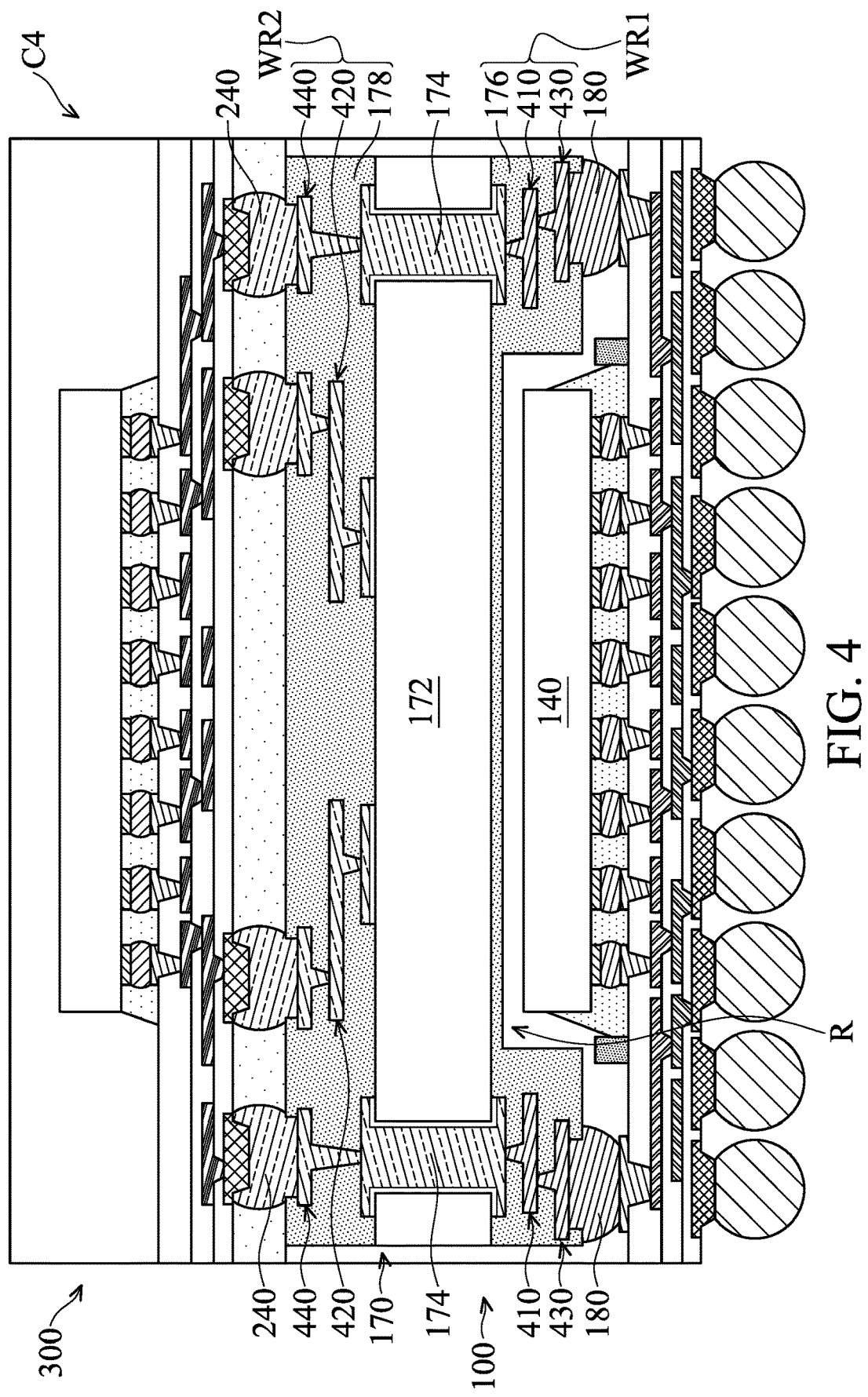
FIG. 4 is a cross-sectional view of a chip package, in accordance with some embodiments.

FIG. 4 is a cross-sectional view of a chip package C4, in accordance with some embodiments. As shown in FIG. 4, the chip package C4 is similar to the chip package C1 of FIG. 1J, except that the recess R of the chip package C4 does not pass through the insulating layer 176, in accordance with some embodiments. Therefore, the recess R does not extend into the substrate 172, in accordance with some embodiments.

The interposer 170 has wiring layers 410 and 420 and conductive pads 430 and 440, in accordance with some embodiments. The wiring layers 410 are in the insulating layer 176 and connected to the conductive pads 430, in accordance with some embodiments. The insulating layer 176 covers portions of the conductive pads 430, in accordance with some embodiments. The wiring layers 410, the conductive pads 430, and the insulating layer 176 together form a wiring structure WR1, in accordance with some embodiments.

The recess R does not pass through the wiring structure WR1, in accordance with some embodiments. The conductive structures 180 are connected to the conductive pads 430, in accordance with some embodiments. The wiring layers 420 are in the insulating layer 178 and connected to the conductive pads 440, in accordance with some embodiments. The insulating layer 178 covers portions of the conductive pads 440, in accordance with some embodiments. The wiring layers 420, the conductive pads 440, and the insulating layer 178 together form a wiring structure WR2, in accordance with some embodiments.

The conductive bumps 240 are connected to the conductive pads 440, in accordance with some embodiments. The conductive pads 440 and the wiring layers 420 are electrically connected to the conductive pads 430 and the wiring layers 410 through the conductive via structures 174, in accordance with some embodiments. The interposers 170 of FIGS. 1E-1J and 3B may include the wiring structures WR1 and WR2 according to requirements.

Figure 5:
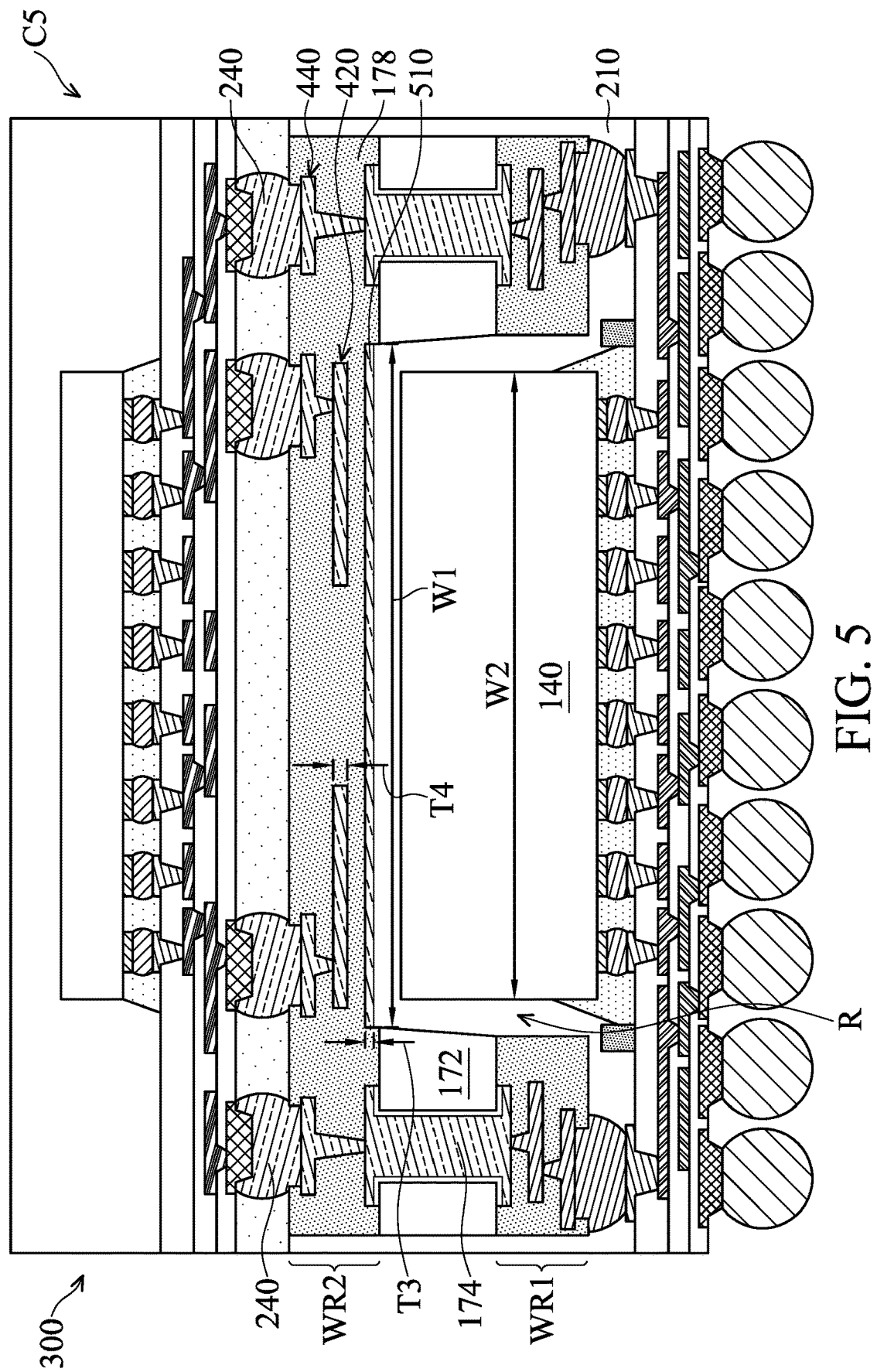
FIG. 5 is a cross-sectional view of a chip package, in accordance with some embodiments.

FIG. 5 is a cross-sectional view of a chip package C5, in accordance with some embodiments. As shown in FIG. 5, the chip package C5 is similar to the chip package C4 of FIG. 4, except that the recess R of the chip package C5 passes through the wiring structure WR1 and the substrate 172, in accordance with some embodiments. The wiring structure WR2 further has a conductive layer 510 in the insulating layer 178, in accordance with some embodiments. The recess R exposes the conductive layer 510, in accordance with some embodiments.

The conductive layer 510 is over the chip 140, in accordance with some embodiments. In some embodiments, a size (e.g., a width W1 or an area) of the conductive layer 510 is greater than a size (e.g., a width W2 or an area) of the chip 140. The conductive layer 510 has a thickness T3 ranging from about 5 μm to about 50 μm, in accordance with some embodiments. The wiring layer 420 has a thickness T4 ranging from about 5 μm to about 40 μm, in accordance with some embodiments.

The conductive layer 510 is used to dissipate the heat generated from the chip 140, in accordance with some embodiments. The molding layer 210 is in direct contact with the conductive layer 510 and the chip 140, in accordance with some embodiments. The conductive layer 510, the conductive via structures 174, the wiring layers 420, and the conductive pads 440 are made of the same material, in accordance with some embodiments. The conductive layer 510 is made of a conductive material, such as metal (e.g. copper, aluminum, or tungsten), in accordance with some embodiments.

Figure 6:
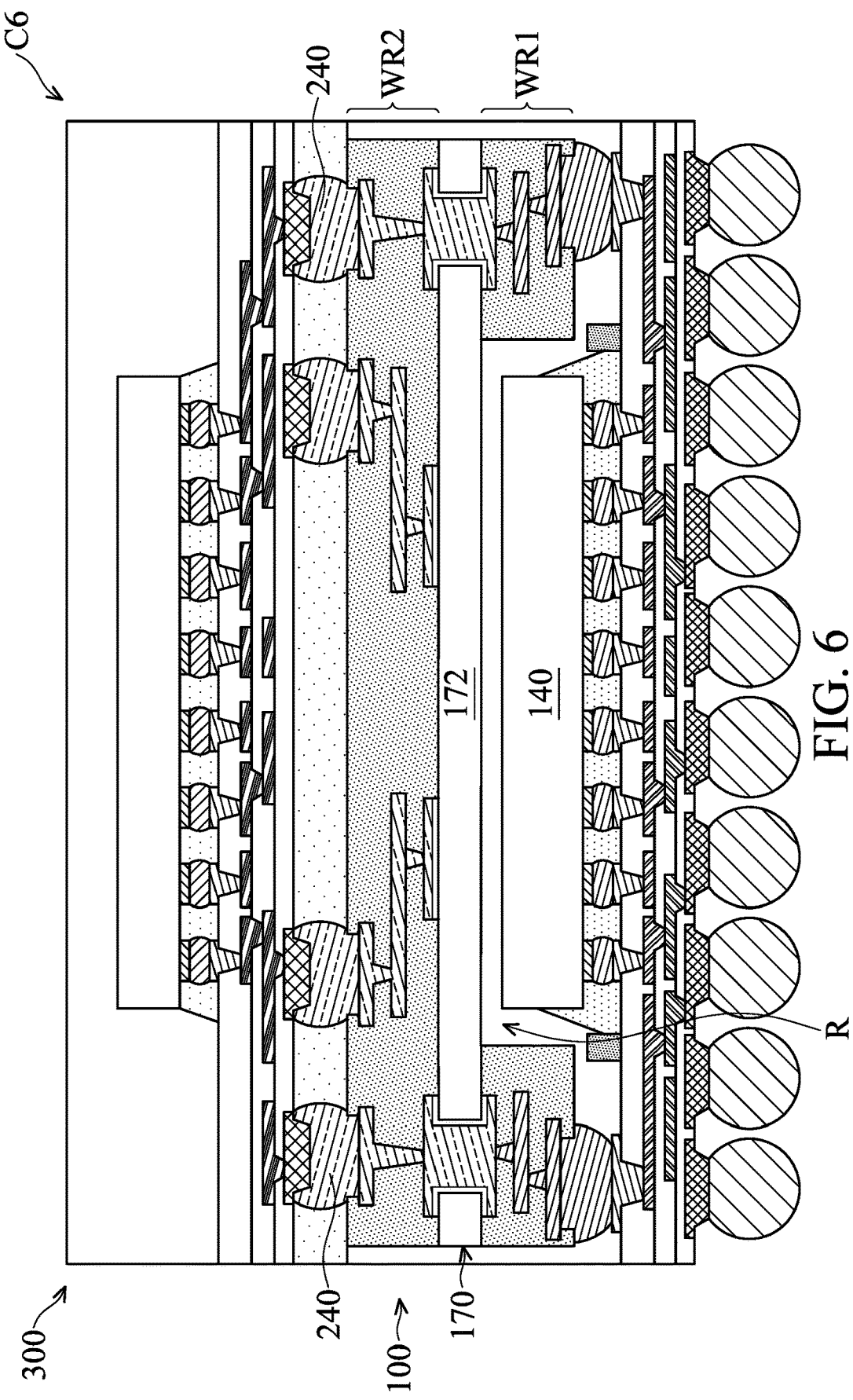
FIG. 6 is a cross-sectional view of a chip package, in accordance with some embodiments.

FIG. 6 is a cross-sectional view of a chip package C6, in accordance with some embodiments. As shown in FIG. 6, the chip package C6 is similar to the chip package C4 of FIG. 4, except that the recess R of the chip package C6 does not extend into the substrate 172, in accordance with some embodiments. The recess R is only in the wiring structure WR1, in accordance with some embodiments.

Figure 7A:
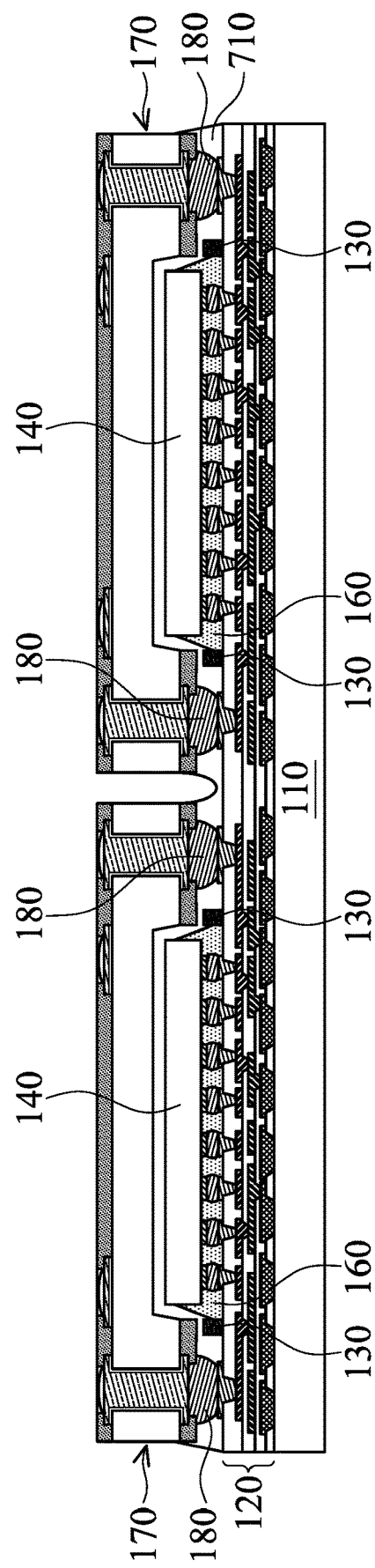
FIGS. 7A-7B are cross-sectional views of various stages of a process for forming a chip package, in accordance with some embodiments.
Figure 7B:
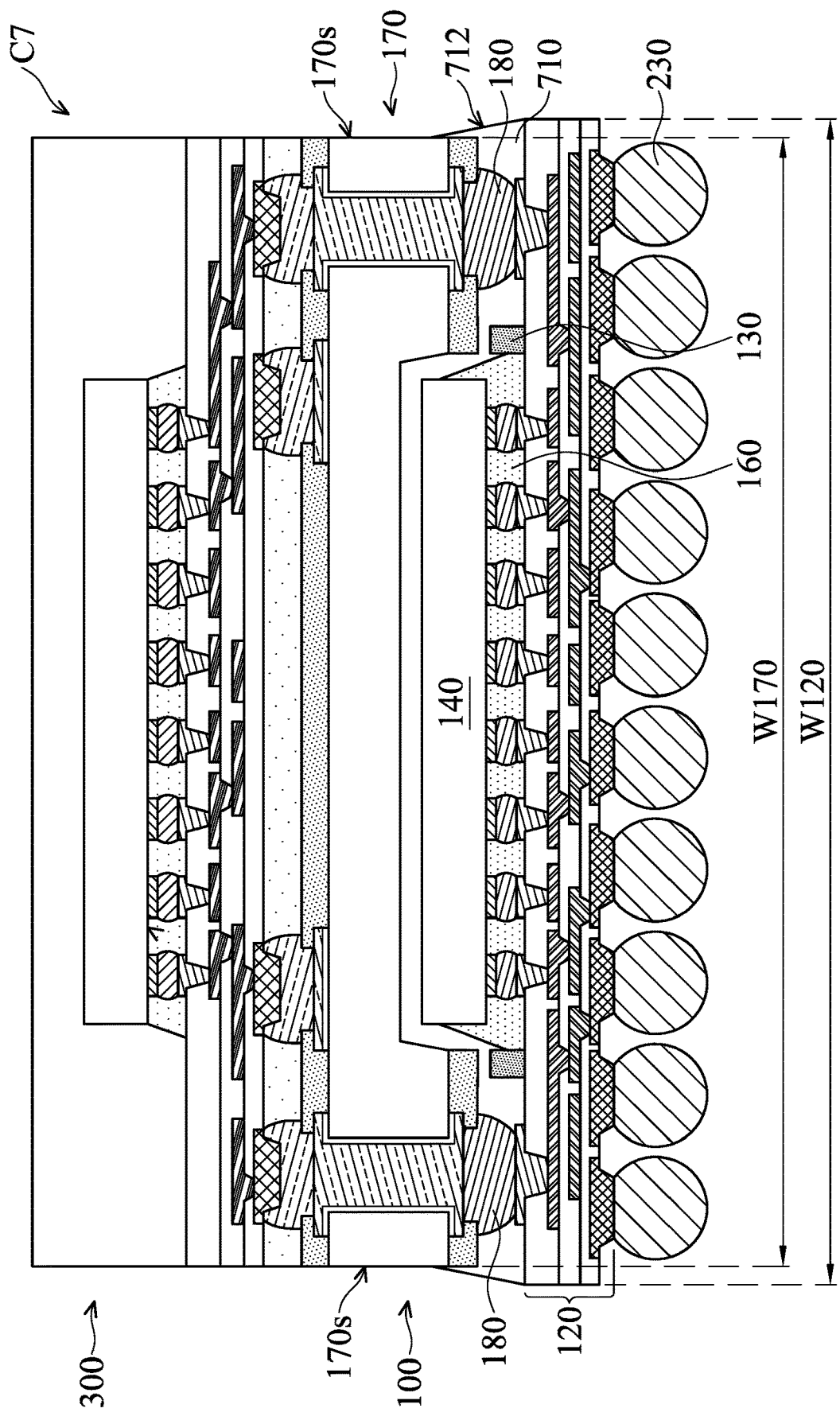

FIGS. 7A-7B are cross-sectional views of various stages of a process for forming a chip package, in accordance with some embodiments. After the step of FIG. 1E is performed, as shown in FIG. 7A, an underfill layer 710 is formed between the interposer substrates 170 and the redistribution structure 120 and between the interposer substrates 170 and the chips 140 thereunder, in accordance with some embodiments. The underfill layer 710 is made of an insulating material, such as a polymer material or a molding compound material consisting of epoxy, fillers, resin, or combinations thereof, in accordance with some embodiments. In some other embodiments, the underfill layers 160 are not formed, and the underfill layer 710 is filled into gaps between the chips 140 and the redistribution structure 120.

As shown in FIG. 7B, the steps of FIGS. 1G-1J are performed, in accordance with some embodiments. As shown in FIG. 7B, chip packages C7 are substantially formed, in accordance with some embodiments. For the sake of simplicity, FIG. 7B only shows one of the chip packages C7, in accordance with some embodiments. The underfill layer 710 surrounds the chip 140, the underfill layer 160, the dam structure 130, the conductive structures 180, and a lower portion of the interposer substrate 170, in accordance with some embodiments.

The underfill layer 710 is in direct contact with the chip 140, the underfill layer 160, the dam structure 130, the conductive structures 180, the interposer substrate 170, and the redistribution structure 120, in accordance with some embodiments. The underfill layer 710 covers potions of sidewalls 170s of the interposer substrate 170, in accordance with some embodiments.

The width W170 of the interposer substrate 170 is less than the width W120 of the redistribution structure 120, in accordance with some embodiments. The underfill layer 710 has an inclined sidewall 712, in accordance with some embodiments. The inclined sidewall 712 surrounds the interposer substrate 170, in accordance with some embodiments.

Figure 8A:
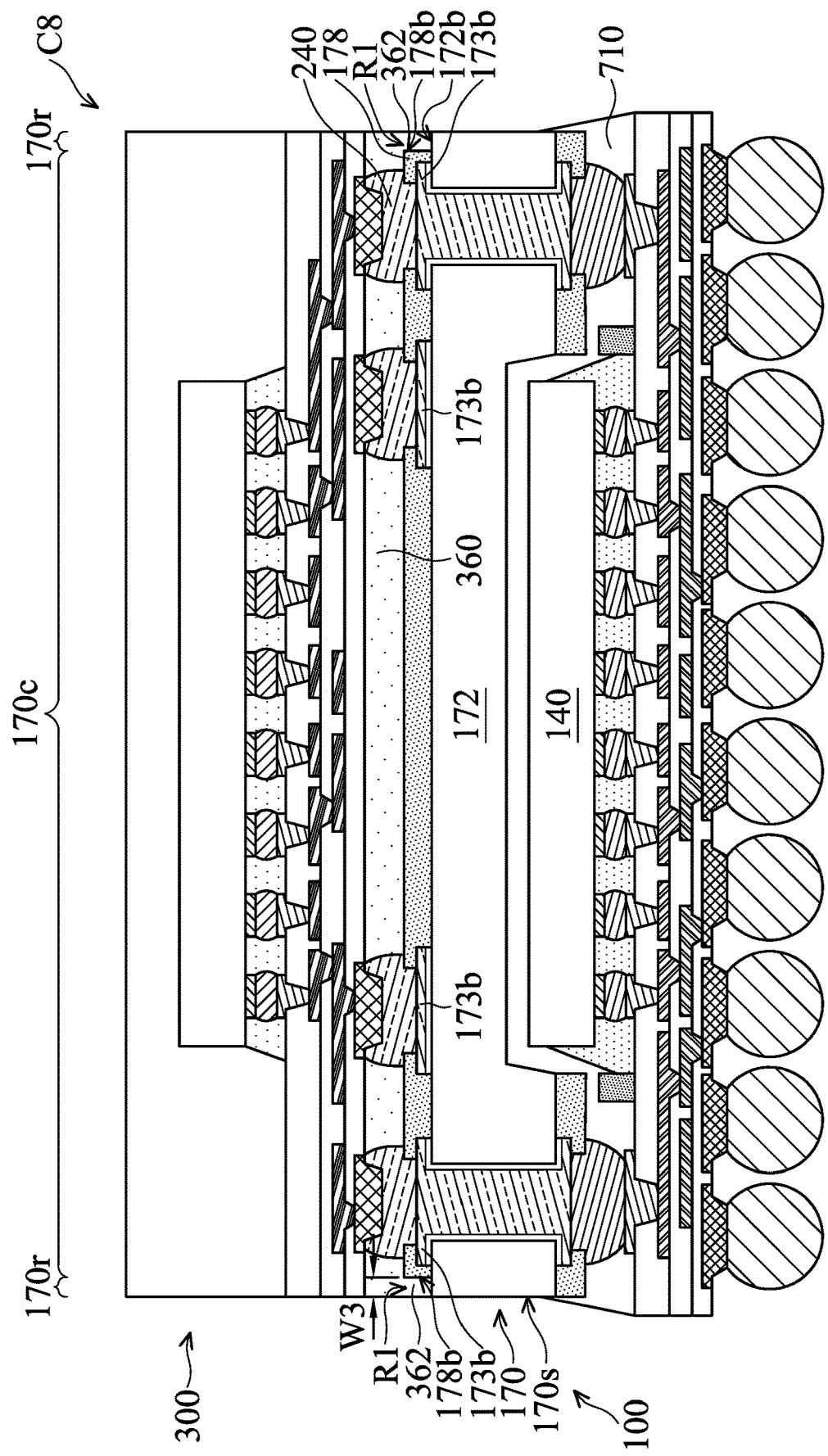
FIG. 8A is a cross-sectional view of a chip package, in accordance with some embodiments.
Figure 8B:
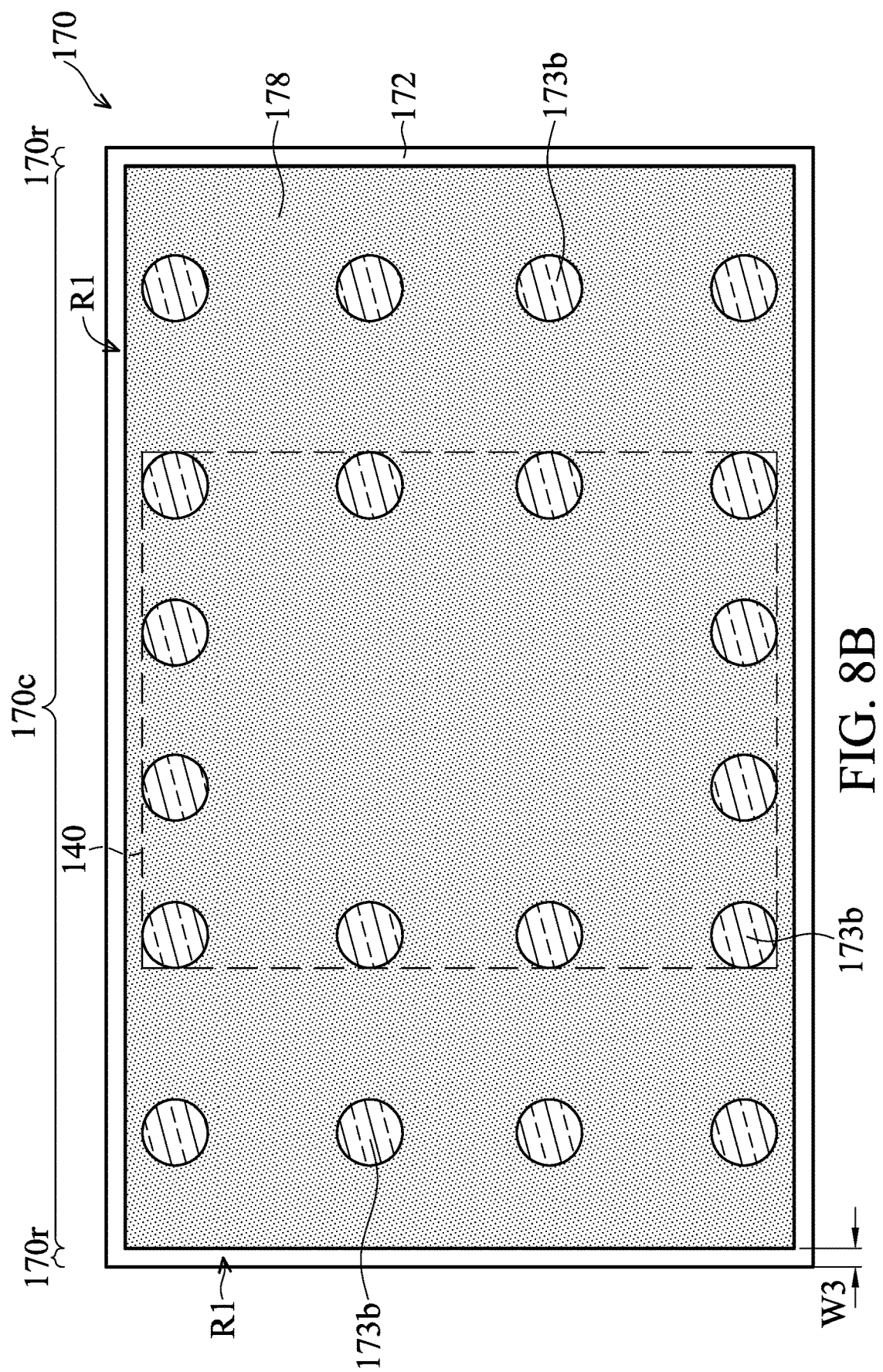
FIG. 8B is a top view of the interposer substrate of the chip package of FIG. 8A, in accordance with some embodiments.

FIG. 8A is a cross-sectional view of a chip package C8, in accordance with some embodiments. FIG. 8B is a top view of the interposer substrate 170 of the chip package C8 of FIG. 8A, in accordance with some embodiments. As shown in FIGS. 8A and 8B, the chip package C8 is similar to the chip package C7 of FIG. 7B, except that the insulating layer 178 of the interposer substrate 170 exposes a portion of the surface 172b of the substrate 172 of the interposer substrate 170, in accordance with some embodiments.

The interposer substrate 170 has a central region 170c and a peripheral region 170r surrounding the central region 170c, in accordance with some embodiments. The exposed portion of the surface 172b is in the peripheral region 170r, in accordance with some embodiments. The exposed portion of the surface 172b continuously surrounds the entire insulating layer 178, in accordance with some embodiments.

The interposer substrate 170 has an edge recess R1, in accordance with some embodiments. The edge recess R1 is surrounded by a sidewall 178b of the insulating layer 178 and the exposed portion of the surface 172b, in accordance with some embodiments. The edge recess R1 has a width W3 ranging from about 20 μm to about 150 μm, in accordance with some embodiments.

If, before bonding the package structure 300 to the interposer substrate 170, the underfill layer 710 extends along the sidewall 170s (of the interposer substrate 170) onto the surface 172b of the substrate 172, the recess R1 may accommodate the underfill layer 710 on the surface 172b to prevent the underfill layer 710 from further extending onto the conductive pads 173b and hindering bonding between the conductive pads 173b and the conductive bumps 240.

The underfill layer 360 between the package structure 300 and the interposer substrate 170 fills the recess R1, in accordance with some embodiments. That is, a portion 362 of the underfill layer 360 extends into the interposer substrate 170, in accordance with some embodiments. The portion 362 has a ring shape, in accordance with some embodiments. The portion 362 continuously surrounds the entire insulating layer 178, in accordance with some embodiments. In some other embodiments, the underfill layer 360 is not formed.

Figure 9A:
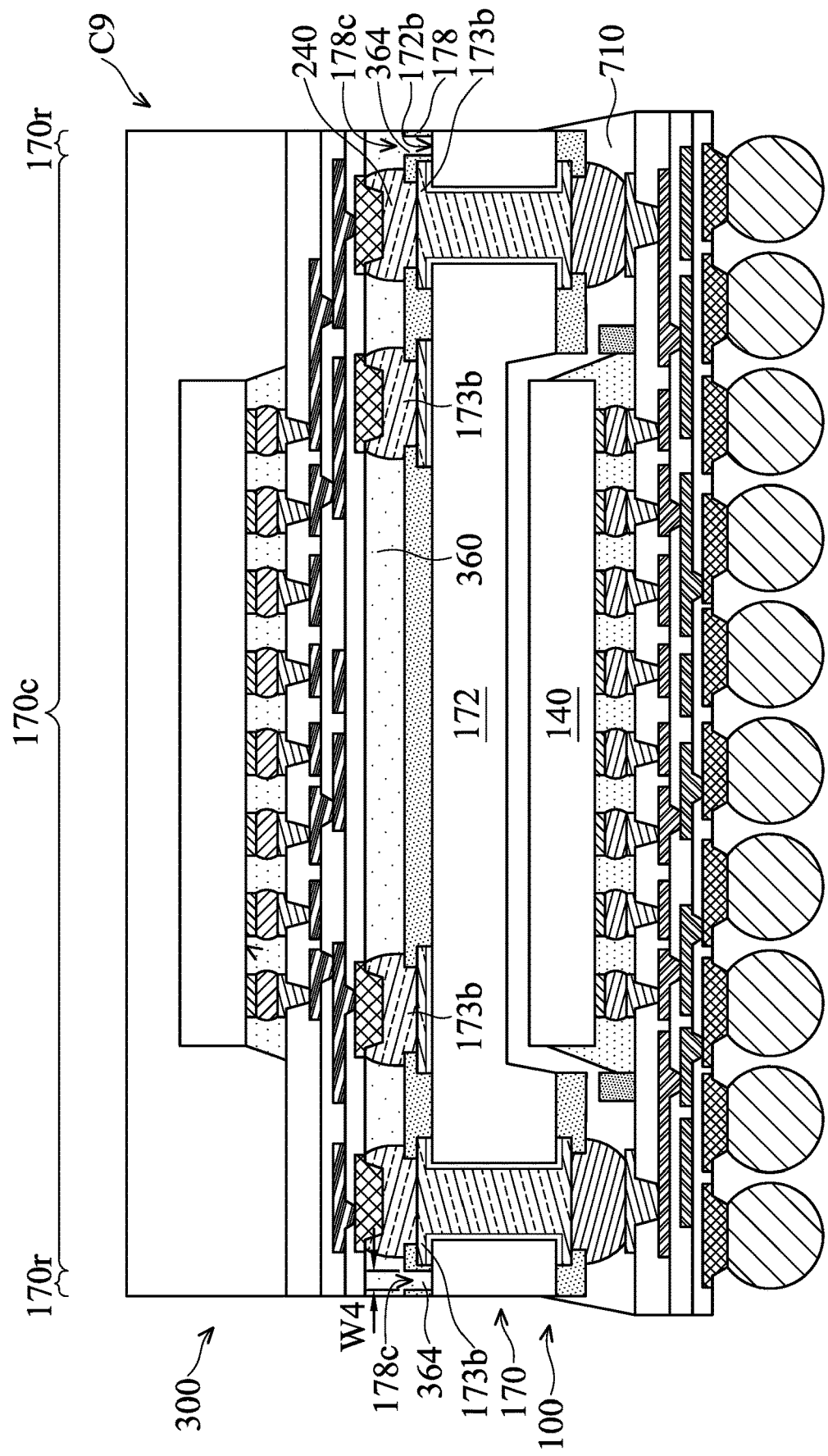
FIG. 9A is a cross-sectional view of a chip package, in accordance with some embodiments.
Figure 9B:
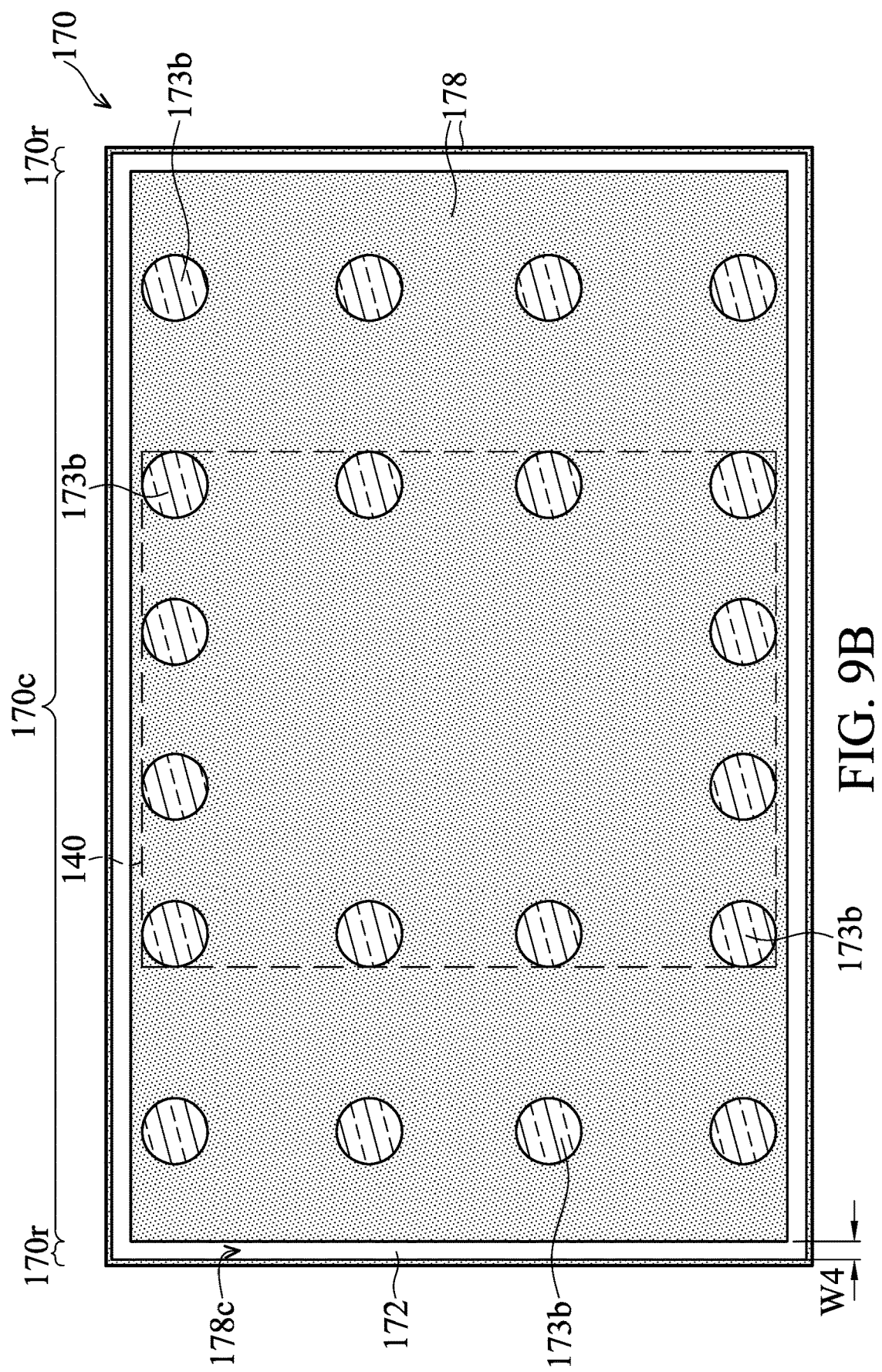
FIG. 9B is a top view of the interposer substrate of the chip package of FIG. 9A, in accordance with some embodiments.

FIG. 9A is a cross-sectional view of a chip package C9, in accordance with some embodiments. FIG. 9B is a top view of the interposer substrate 170 of the chip package C9 of FIG. 9A, in accordance with some embodiments. As shown in FIGS. 9A and 9B, the chip package C9 is similar to the chip package C7 of FIG. 7B, except that the insulating layer 178 of the interposer substrate 170 has a trench 178c, in accordance with some embodiments.

The trench 178c exposes the surface 172b of the substrate 172 in the peripheral region 170r, in accordance with some embodiments. The trench 178c surrounds all of the conductive pads 173b, in accordance with some embodiments. The trench 178c has a width W4 ranging from about 20 μm to about 150 μm, in accordance with some embodiments.

The trench 178c is used to accommodate the underfill layer 710 extending onto the surface 172b to prevent the underfill layer 710 from further extending onto the conductive pads 173b and hindering bonding between the conductive pads 173b and the conductive bumps 240.

The underfill layer 360 between the package structure 300 and the interposer substrate 170 fills the trench 178c, in accordance with some embodiments. That is, a portion 364 of the underfill layer 360 extends into the interposer substrate 170, in accordance with some embodiments. The portion 364 has a ring shape, in accordance with some embodiments. The portion 364 continuously surrounds all of the conductive pads 173b, in accordance with some embodiments.

Figure 10A:
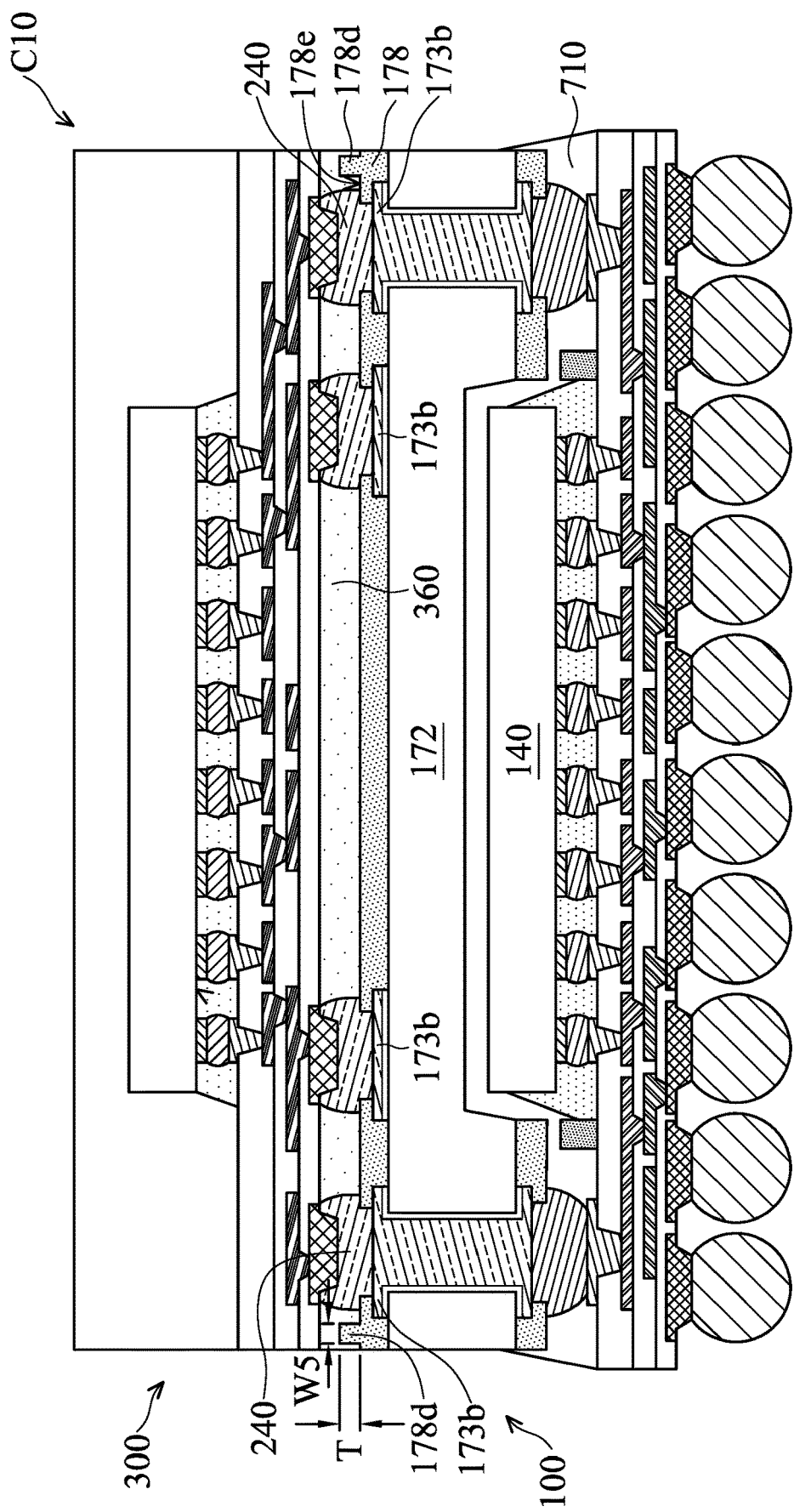
FIG. 10A is a cross-sectional view of a chip package, in accordance with some embodiments.
Figure 10B:
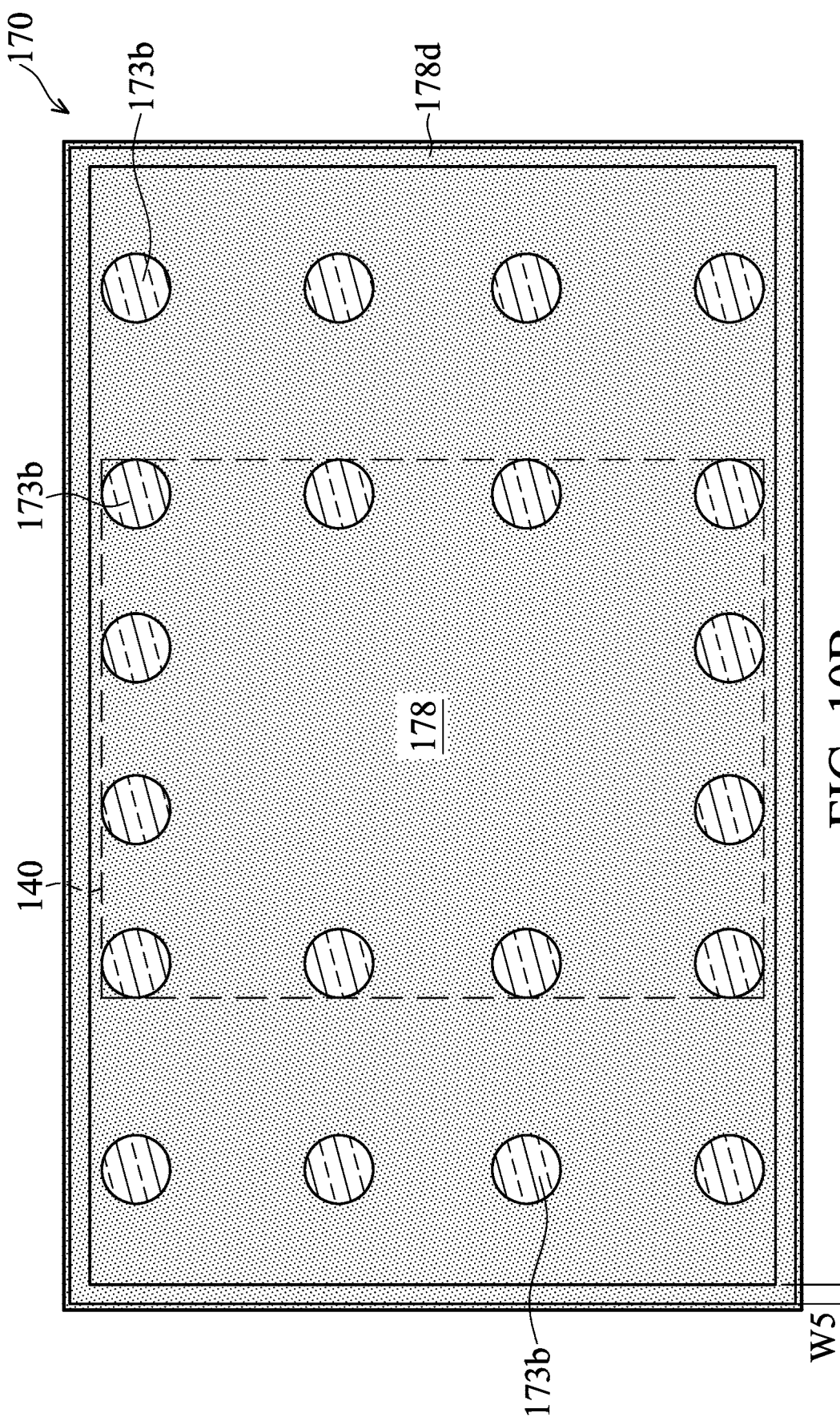
FIG. 10B is a top view of the interposer substrate of the chip package of FIG. 10A, in accordance with some embodiments.

FIG. 10A is a cross-sectional view of a chip package C10, in accordance with some embodiments. FIG. 10B is a top view of the interposer substrate 170 of the chip package C10 of FIG. 10A, in accordance with some embodiments. As shown in FIGS. 10A and 10B, the chip package C10 is similar to the chip package C7 of FIG. 7B, except that the insulating layer 178 of the interposer substrate 170 has a protruding portion 178d, in accordance with some embodiments. The protruding portion 178d protrudes from an upper surface 178e of the insulating layer 178, in accordance with some embodiments.

The protruding portion 178d continuously surrounds all of the conductive pads 173b, in accordance with some embodiments. The protruding portion 178d has a ring shape, in accordance with some embodiments. The protruding portion 178d extends into the underfill layer 360 between the package structure 300 and the interposer substrate 170, in accordance with some embodiments.

The protruding portion 178d has a width W5 ranging from about 20 μm to about 150 μm, in accordance with some embodiments. The protruding portion 178d has a thickness T ranging from about 10 μm to about 80 μm, in accordance with some embodiments. The protruding portion 178d is used to prevent the underfill layer 710 from extending onto the conductive pads 173b and hindering bonding between the conductive pads 173b and the conductive bumps 240, in accordance with some embodiments.

Figure 11:
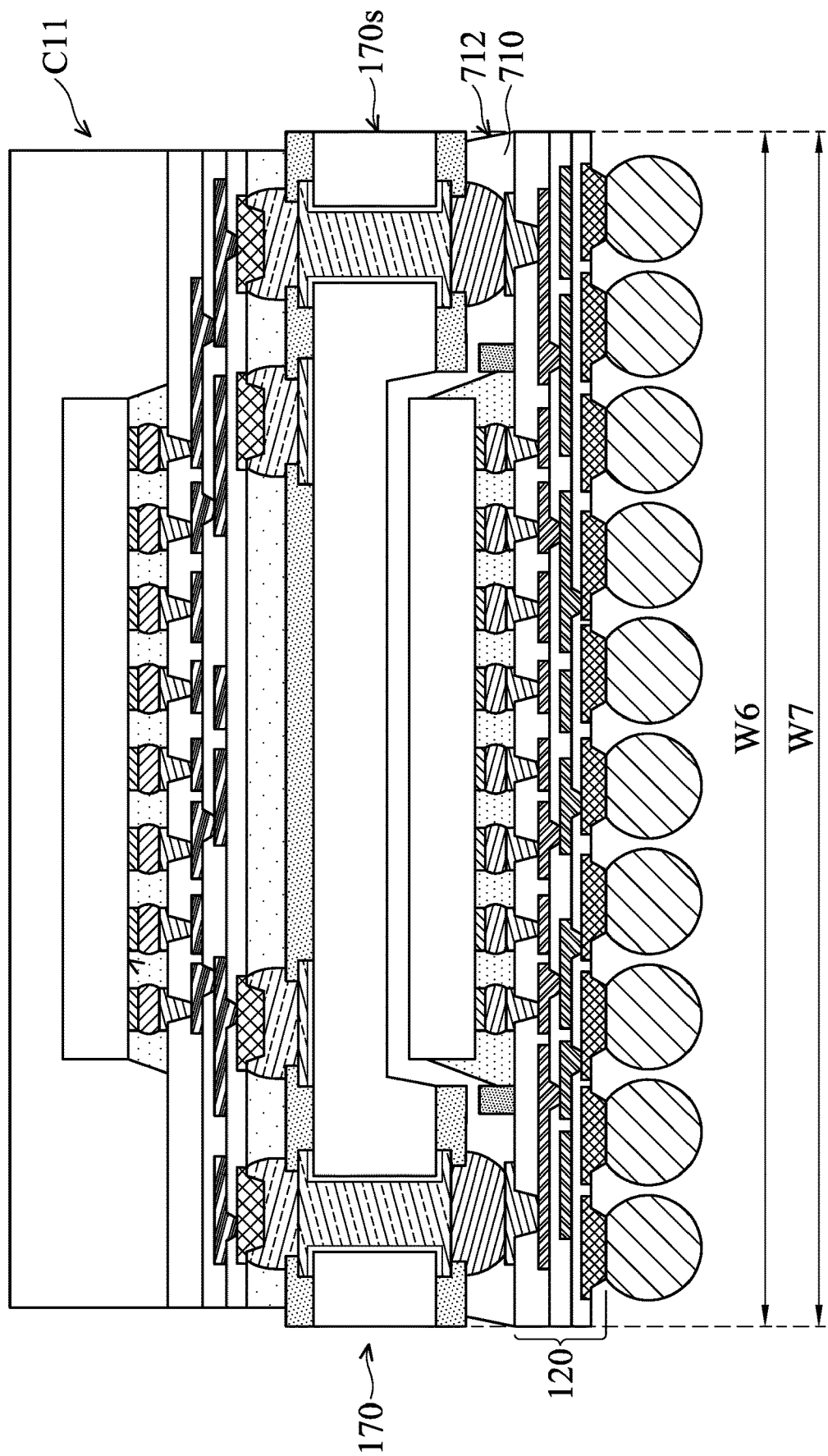
FIG. 11 is a cross-sectional view of a chip package, in accordance with some embodiments.

FIG. 11 is a cross-sectional view of a chip package C11, in accordance with some embodiments. As shown in FIG. 11, the chip package C11 is similar to the chip package C7 of FIG. 7B, except that the width W6 of the interposer substrate 170 is substantially equal to or greater than the width W7 of the redistribution structure 120, in accordance with some embodiments.

The underfill layer 710 is formed between the interposer substrate 170 and the redistribution structure 120, in accordance with some embodiments. The underfill layer 710 does not extend onto the sidewall 170s of the interposer substrate 170, in accordance with some embodiments. The underfill layer 710 has an inclined sidewall 712, in accordance with some embodiments. The inclined sidewall 712 is between the interposer substrate 170 and the redistribution structure 120, in accordance with some embodiments.

Figure 12:
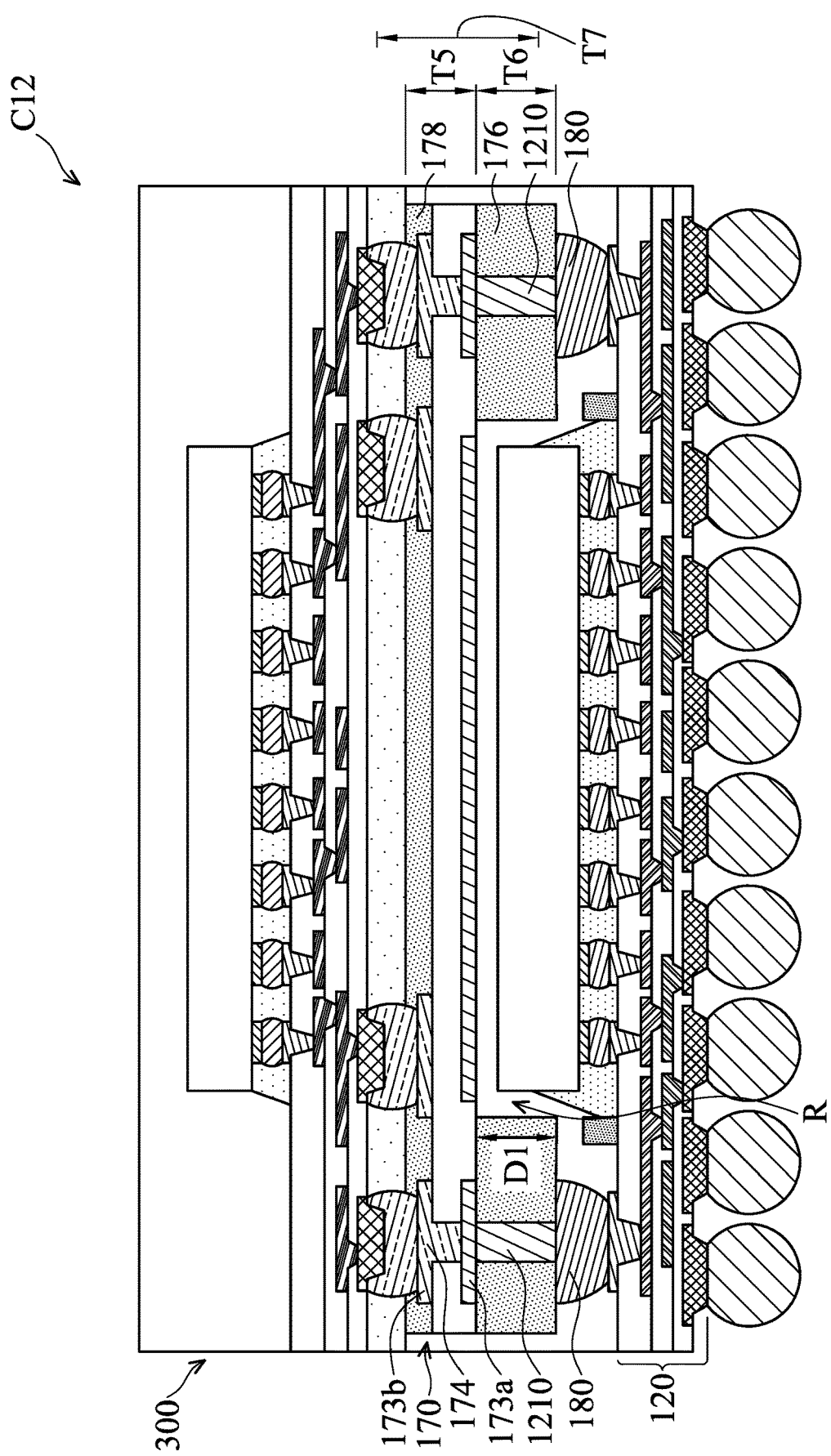
FIG. 12 is a cross-sectional view of a chip package, in accordance with some embodiments.

FIG. 12 is a cross-sectional view of a chip package C12, in accordance with some embodiments. As shown in FIG. 12, the chip package C12 is similar to the chip package C1 of FIG. 1J, except that the interposer substrate 170 of the chip package C12 further has conductive via structures 1210, in accordance with some embodiments.

The conductive via structures 1210 pass through the insulating layer 176, in accordance with some embodiments. The conductive via structures 1210 are connected to the conductive pads 173a thereover and the conductive structures 180 thereunder, in accordance with some embodiments. The conductive via structures 1210 are in direct contact with the conductive structures 180 thereunder, in accordance with some embodiments.

The total thickness T5 of the substrate 172 and the insulating layer 178 ranges from about 20 µm to about 100 µm, in accordance with some embodiments. The thickness T6 of the insulating layer 176 ranges from about 30 µm to about 200 µm, in accordance with some embodiments. The total thickness T7 of the interposer substrate 170 ranges from about 50 µm to about 300 µm, in accordance with some embodiments.

The recess R has a depth D1 ranging from about 30 µm to about 200 µm, in accordance with some embodiments.

The insulating layers 176 and 178 are made of different materials, in accordance with some embodiments. The insulating layer 176 is made of a polymer material, in accordance with some embodiments. The insulating layer 176 includes an Ajinomoto build-up film (ABF), in accordance with some embodiments. The insulating layer 178 is made of a polymer material, such as a solder resist material (e.g., polyimide), in accordance with some embodiments. The substrate 172 is made of an insulating material, such as a polymer material, in accordance with some embodiments.

Figure 13:
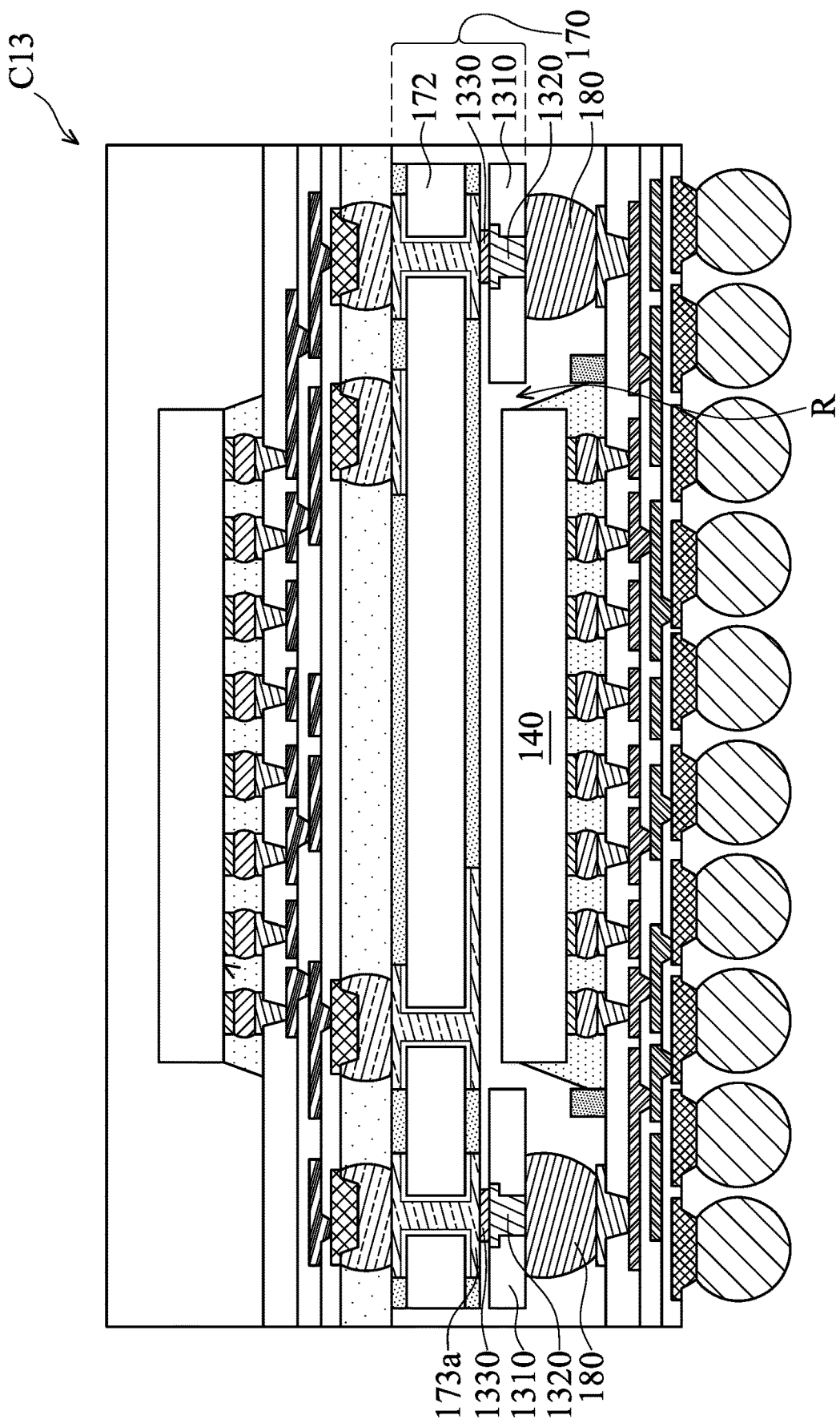
FIG. 13 is a cross-sectional view of a chip package, in accordance with some embodiments.

FIG. 13 is a cross-sectional view of a chip package C13, in accordance with some embodiments. As shown in FIG. 13, the chip package C13 is similar to the chip package C1 of FIG. 1J, except that the interposer substrate 170 of the chip package C13 further has a substrate 1310, conductive via structures 1320, and solder layers 1330, in accordance with some embodiments. The recess R passes through the substrate 1310, in accordance with some embodiments. The substrate 1310 is made of a polymer material, a fiber material, a semiconductor material, a glass material, a metal material, or another suitable material.

The conductive via structures 1320 pass through the substrate 1310, in accordance with some embodiments. The conductive via structures 1320 are connected to the conductive structures 180 thereunder, in accordance with some embodiments. The substrate 1310 and the conductive via structures 1320 surround the chip 140, in accordance with some embodiments. The conductive via structures 1320 are made of a conductive material, such as copper, aluminum, or tungsten, in accordance with some embodiments.

The solder layers 1330 are between and connected to the conductive via structures 1320 and the conductive pads 173a, in accordance with some embodiments. The solder layers 1330 are made of a solder material, such as Sn and Ag or another suitable conductive material, in accordance with some embodiments.

Figure 14A:
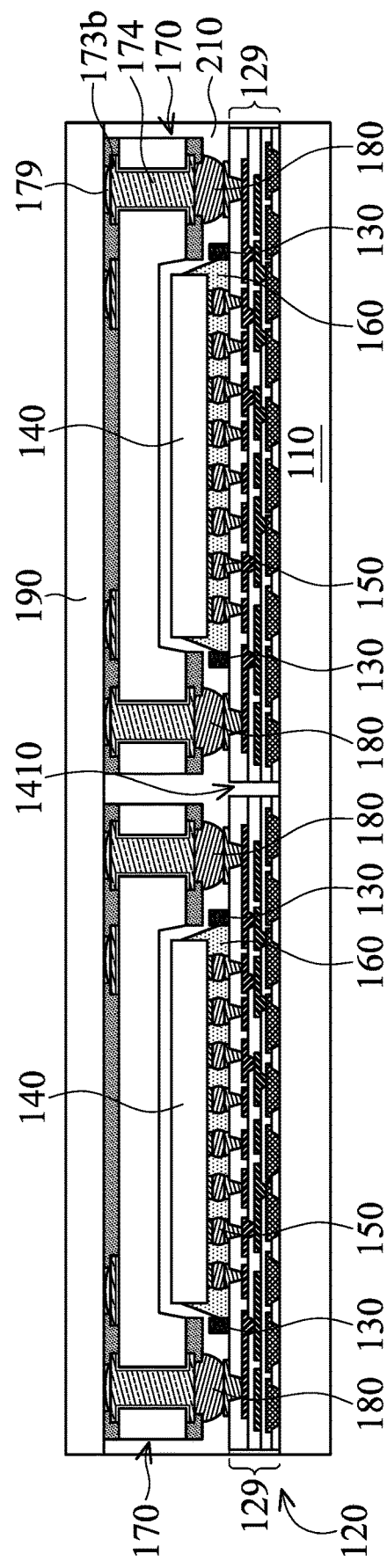
FIGS. 14A-14D are cross-sectional views of various stages of a process for forming a chip package, in accordance with some embodiments.

FIGS. 14A-14D are cross-sectional views of various stages of a process for forming a chip package, in accordance with some embodiments. After the step of FIG. 1E is performed, as shown in FIG. 14A, a trench 1410 is formed in the redistribution structure 120, in accordance with some embodiments. The trench 1410 passes through the redistribution structure 120 between the interposer substrates 170 and between the conductive structures 180 under different interposer substrates 170, in accordance with some embodiments.

The trench 1410 divides the redistribution structure 120 into portions 129, in accordance with some embodiments. The portions 129 are spaced apart from each other, in accordance with some embodiments. Each of the portions 129 is under one of the interposer substrates 170, in accordance with some embodiments. The trench 1410 is formed using a sawing process, in accordance with some embodiments.

As shown in FIG. 14A, a release film 190 is formed over the interposer substrates 170 to cover the conductive layers 179 and the conductive via structures 174, in accordance with some embodiments. Thereafter, as shown in FIG. 14A, a molding layer 210 is formed between the release film 190, the interposer substrates 170, the portions 129, and the chips 140, in accordance with some embodiments. The molding layer 210 surrounds the interposer substrates 170, the chips 140, the conductive bumps 150, the underfill layer 160, the dam structures 130, and the portions 129, in accordance with some embodiments.

Figure 14B:
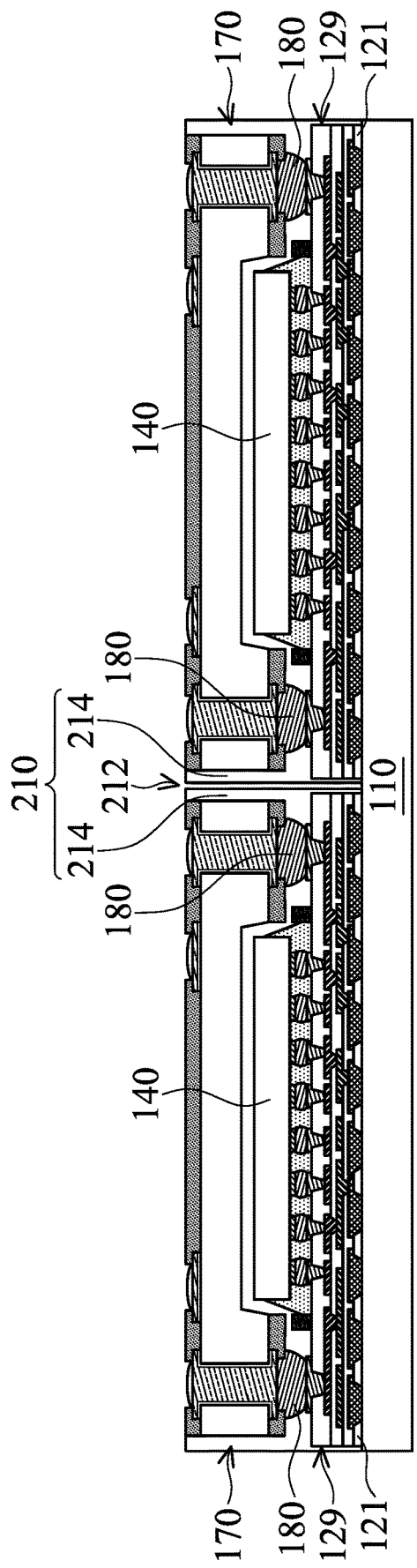

As shown in FIG. 14B, the release film 190 is removed, in accordance with some embodiments. As shown in FIG. 14B, a trench 212 is formed in the molding layer 210, in accordance with some embodiments. The trench 212 passes through the molding layer 210 between the interposer substrates 170 and between the conductive structures 180 under different interposer substrates 170, in accordance with some embodiments.

The trench 212 divides the molding layer 210 into portions 214, in accordance with some embodiments. The portions 214 are spaced apart from each other, in accordance with some embodiments. Each of the portions 214 surrounds one of the interposer substrates 170 and the chip 140 and the portion 129 under the one of the interposer substrates 170, in accordance with some embodiments. The trench 212 is formed using a cutting process, in accordance with some embodiments.

Figure 14C:
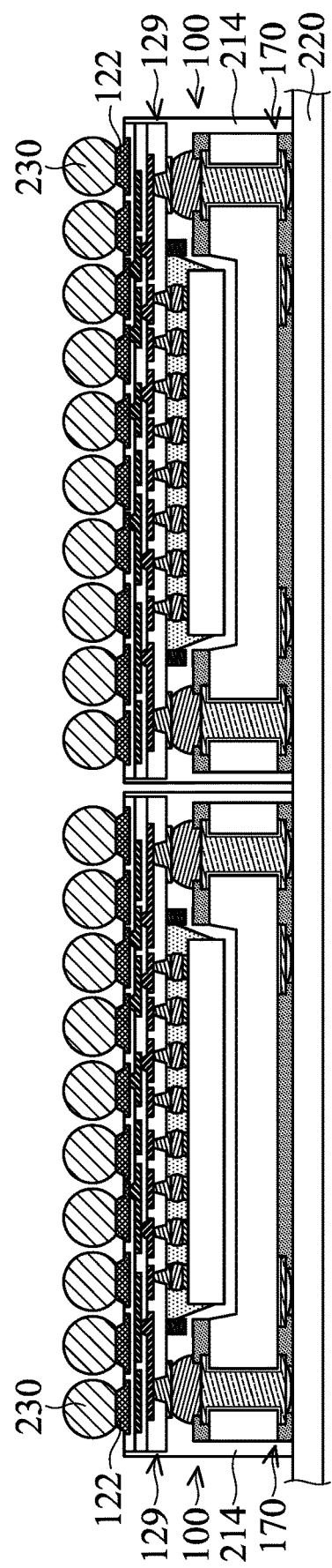

As shown in FIG. 14C, the carrier substrate 110 is removed, in accordance with some embodiments. As shown in FIG. 14C, the interposer substrates 170 are flipped upside down, in accordance with some embodiments. As shown in FIG. 14C, the interposer substrates 170 are disposed over a carrier substrate 220, in accordance with some embodiments. As shown in FIG. 14C, the insulating layers 121 of the portions 129 are removed, in accordance with some embodiments.

In some embodiments, the portions 214 of the molding layer 210 adjacent to the insulating layers 121 are removed during removing the insulating layers 121. In some other embodiments (not shown), the portions 214 of the molding layer 210 adjacent to the insulating layers 121 are remained after removing the insulating layers 121. As shown in FIG. 14C, conductive bumps 230 are respectively formed over the conductive pads 122, in accordance with some embodiments. At this step, chip packages 100 are substantially formed, in accordance with some embodiments.

Figure 14D:
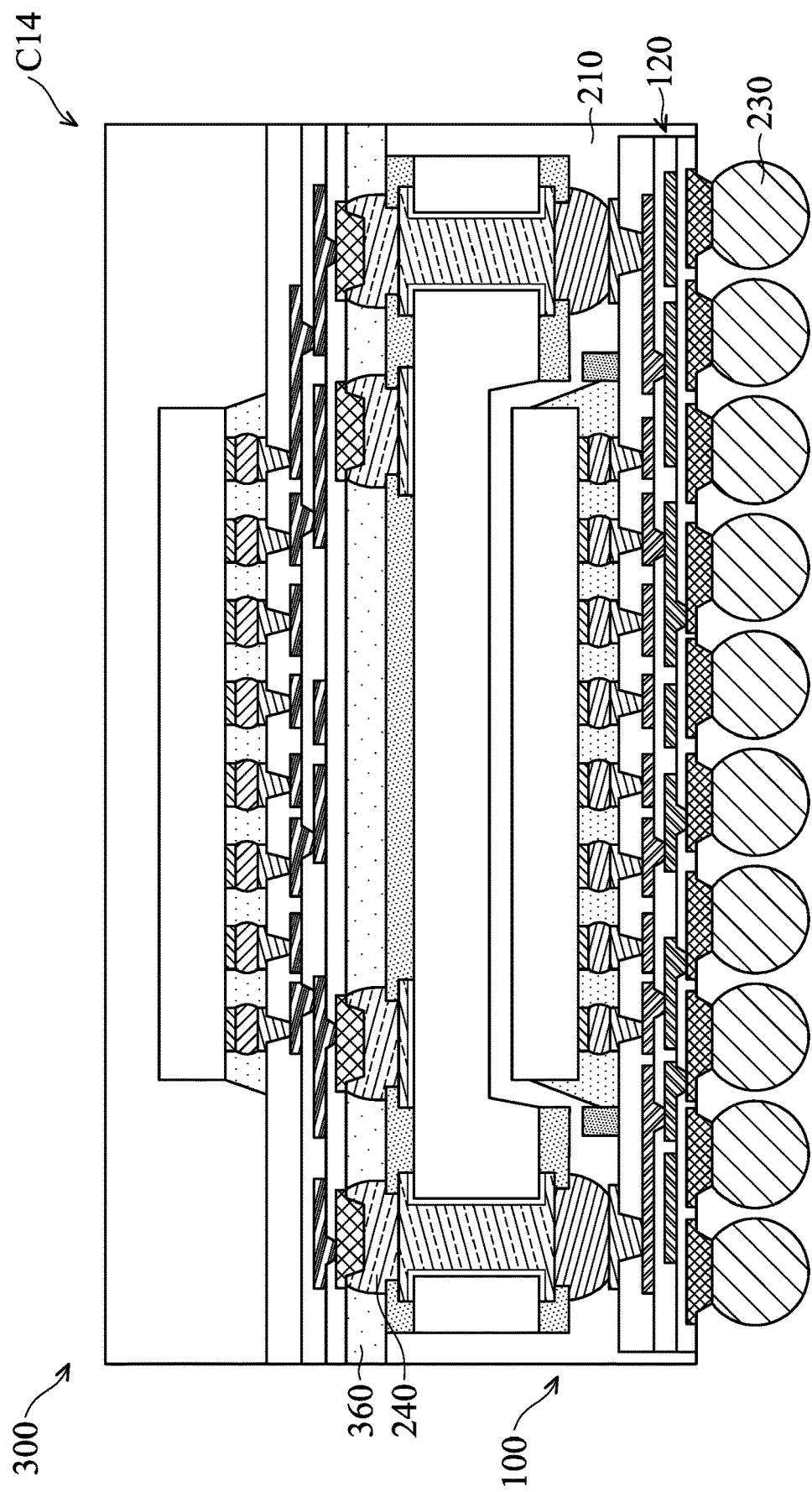

As shown in FIG. 14D, the carrier substrate 220 is removed, in accordance with some embodiments. As shown in FIG. 14D, the step of FIG. 1J is performed to form chip packages C14, in accordance with some embodiments. For the sake of simplicity, FIG. 14D only shows one of the chip packages C14, in accordance with some embodiments. In the chip package C14, the molding layer 210 surrounds the redistribution structure 120, in accordance with some embodiments.

Figure 15:
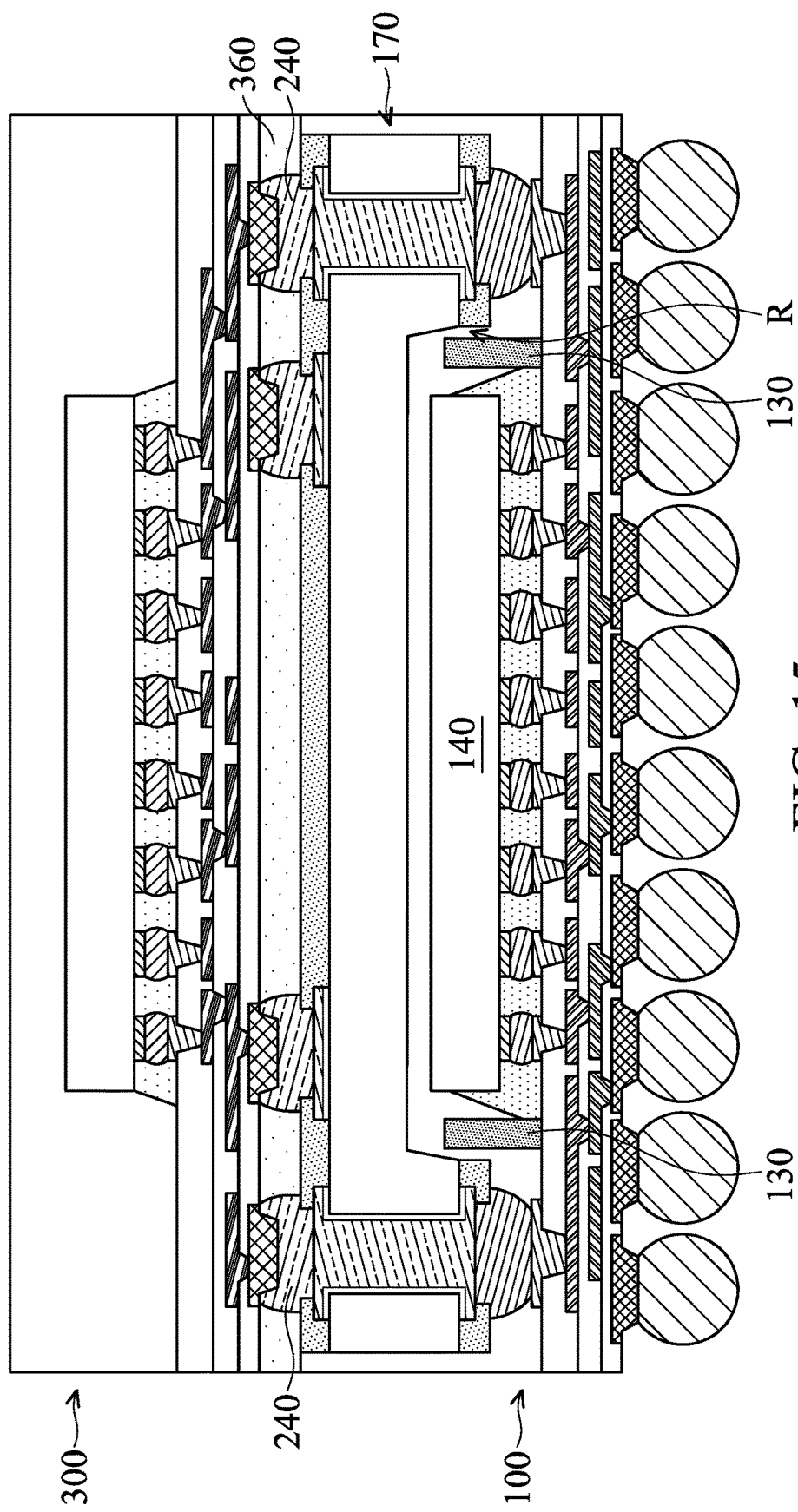
FIG. 15 is a cross-sectional view of a chip package, in accordance with some embodiments.

FIG. 15 is a cross-sectional view of a chip package C15, in accordance with some embodiments. As shown in FIG. 15, the chip package C15 is similar to the chip package C1 of FIG. 1J, except that a top portion of the dam structure 130 of the chip package C15 extends into the recess R of the interposer substrate 170, in accordance with some embodiments.

The interposers 170 of FIGS. 7A-14D may have the wiring structures WR1 and WR2 of FIG. 4, 5 or 6. The interposers 170 of FIGS. 7A-14D may be replaced by the interposers 170 of FIGS. 2 and 4-6.

In accordance with some embodiments, chip packages and methods for forming the same are provided. The methods (for forming the chip package) bond an interposer substrate to a redistribution structure, and a chip is between the interposer substrate and the redistribution structure and is partially in the interposer substrate. The interposer substrate may decrease the warpage of a chip package (including the interposer substrate, the redistribution structure, and the chip). As a result, the bonding yield between the chip package and a package structure is improved. The interposer substrate increases stiffness and mechanical strength of the chip package. The wiring layers and the conductive pads of the interposer substrate are substantially not affected by the stress caused by thermal expansion mismatch between the molding layer and the chip of the chip package. Since the chip is partially in the interposer substrate, the total thickness of the chip package is decreased.

In accordance with some embodiments, a chip package is provided. The chip package includes a redistribution structure including an insulating layer and a wiring layer. The wiring layer is in the insulating layer. The chip package includes a chip over the redistribution structure and electrically connected to the wiring layer. The chip package includes an interposer substrate over the redistribution structure and the chip, wherein a portion of the chip is in the interposer substrate. The chip package includes a conductive structure between the interposer substrate and the redistribution structure and electrically connected to the wiring layer. The conductive structure includes a conductive bump or a conductive pillar. The chip package includes a molding layer surrounding the interposer substrate and the conductive structure. The molding layer is partially between the interposer substrate and the redistribution structure and partially between the interposer substrate and the chip.

In accordance with some embodiments, a chip package is provided. The chip package includes a redistribution structure including a first insulating layer and a first wiring layer. The first wiring layer is in the first insulating layer. The chip package includes a chip over the redistribution structure and electrically connected to the first wiring layer. The chip package includes an interposer substrate over the redistribution structure and the chip. The interposer substrate includes a substrate and a wiring structure, the wiring structure is between the substrate and the redistribution structure, the wiring structure includes a second insulating layer and a second wiring layer in the second insulating layer, and a portion of the chip is in the wiring structure. The chip package includes a conductive structure between the interposer substrate and the redistribution structure and electrically connected to the first wiring layer. The conductive structure includes a conductive bump or a conductive pillar.

In accordance with some embodiments, a chip package is provided. The chip package includes a redistribution structure including an insulating layer and a wiring layer. The wiring layer is in the insulating layer. The chip package includes a chip over the redistribution structure and electrically connected to the wiring layer. The chip package includes an interposer substrate over the redistribution structure and the chip, wherein a portion of the chip is in the interposer substrate, and the redistribution structure is wider than the interposer substrate. The chip package includes a conductive structure between the interposer substrate and the redistribution structure and electrically connected to the wiring layer. The conductive structure includes a conductive bump or a conductive pillar. The chip package includes an underfill layer between the interposer substrate and the redistribution structure and surrounding the interposer substrate, the conductive structure, and the chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
   a redistribution structure comprising an insulating layer and a wiring layer, wherein the wiring layer is in the insulating layer;
   a chip over the redistribution structure and electrically connected to the wiring layer;
   an interposer substrate over the redistribution structure and the chip, wherein a portion of the chip is in the interposer substrate;
   a conductive structure between the interposer substrate and the redistribution structure and electrically connected to the wiring layer, wherein the conductive structure comprises a conductive bump or a conductive pillar;
   a molding layer surrounding the interposer substrate and the conductive structure, wherein the molding layer is partially between the interposer substrate and the redistribution structure and partially between the interposer substrate and the chip; and
   a dam structure over the redistribution structure and surrounding the chip, wherein the molding layer is between the dam structure and the conductive structure.

2. The chip package as claimed in claim 1, wherein the molding layer is partially between the dam structure and the interposer substrate.

3. The chip package as claimed in claim 1, wherein the interposer substrate has a conductive layer over the chip, and the molding layer between the interposer substrate and the chip is in direct contact with the conductive layer and the chip.

4. The chip package as claimed in claim 3, wherein the conductive layer is wider than the chip.

5. The chip package as claimed in claim 1, further comprising:
   a package structure over the interposer substrate, wherein the package structure is electrically connected to the wiring layer of the redistribution structure through the interposer substrate; and
   an underfill layer between the package structure and the interposer substrate.

6. The chip package as claimed in claim 5, wherein a portion of the underfill layer extends into the interposer substrate.

7. The chip package as claimed in claim 6, wherein the portion has a ring shape.

8. The chip package as claimed in claim 5, wherein a portion of the interposer substrate extends into the underfill layer.

9. The chip package as claimed in claim 8, wherein the portion has a ring shape.

10. The chip package as claimed in claim 1, wherein the interposer substrate comprises a substrate and an insulating layer over the substrate, and the chip passes through the insulating layer.

11. The chip package as claimed in claim 10, wherein the chip extends into the substrate.

12. A chip package, comprising:
 a redistribution structure comprising a first insulating layer and a first wiring layer, wherein the first wiring layer is in the first insulating layer;
 a chip over the redistribution structure and electrically connected to the first wiring layer;
 an interposer substrate over the redistribution structure and the chip, wherein the interposer substrate comprises a substrate and a wiring structure, the wiring structure is between the substrate and the redistribution structure, the wiring structure comprises a second insulating layer and a second wiring layer in the second insulating layer, a portion of the chip is in the wiring structure, and a topmost surface of the chip is spaced apart from the interposer substrate; and
 a conductive structure between the interposer substrate and the redistribution structure and electrically connected to the first wiring layer, wherein the conductive structure comprises a conductive bump or a conductive pillar.

13. The chip package as claimed in claim 12, further comprising:
 an adhesive layer between and in direct contact with the chip and the interposer substrate.

14. The chip package as claimed in claim 12, wherein the chip passes through the wiring structure.

15. The chip package as claimed in claim 14, wherein the chip is partially in the substrate.

16. The chip package as claimed in claim 12, further comprising:
 a molding layer surrounding the interposer substrate and the conductive structure, wherein the molding layer is partially between the interposer substrate and the redistribution structure and partially between the interposer substrate and the chip.

17. The chip package as claimed in claim 12, wherein the wiring structure is thicker than the substrate.

18. A chip package, comprising:
 a redistribution structure comprising an insulating layer and a wiring layer, wherein the wiring layer is in the insulating layer;
 a chip over the redistribution structure and electrically connected to the wiring layer;
 an interposer substrate over the redistribution structure and the chip, wherein a portion of the chip is in the interposer substrate, and the redistribution structure is wider than the interposer substrate;
 a conductive structure between the interposer substrate and the redistribution structure and electrically connected to the wiring layer, wherein the conductive structure comprises a conductive bump or a conductive pillar; and
 an underfill layer between the interposer substrate and the redistribution structure and surrounding the interposer substrate, the conductive structure, and the chip, wherein the underfill layer covers a lower portion of a sidewall of the interposer substrate and exposes an upper portion of the sidewall.

19. The chip package as claimed in claim 18, further comprising:
 a dam structure over the redistribution structure and surrounding the chip, wherein the underfill layer is partially between the dam structure and the conductive structure.

20. The chip package as claimed in claim 19, wherein the dam structure is partially in the interposer substrate.

* * * * *